(12) United States Patent
Nozawa et al.

(10) Patent No.: US 12,048,170 B2
(45) Date of Patent: Jul. 23, 2024

(54) IMAGING DEVICE

(71) Applicant: Panasonic Intellectual Property Management Co., Ltd., Osaka (JP)

(72) Inventors: Katsuya Nozawa, Osaka (JP); Takeyoshi Tokuhara, Osaka (JP); Nozomu Matsukawa, Nara (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 610 days.

(21) Appl. No.: 17/205,061

(22) Filed: Mar. 18, 2021

(65) Prior Publication Data

US 2021/0202582 A1  Jul. 1, 2021

Related U.S. Application Data

(63) Continuation of application No. PCT/JP2020/011109, filed on Mar. 13, 2020.

(30) Foreign Application Priority Data

Apr. 10, 2019  (JP) .................................. 2019-075159
Jan. 17, 2020  (JP) .................................. 2020-006104

(51) Int. Cl.
*H10K 39/32*   (2023.01)
*H10K 19/20*   (2023.01)
(Continued)

(52) U.S. Cl.
CPC ............. *H10K 39/32* (2023.02); *H10K 19/20* (2023.02); *H10K 30/30* (2023.02); *H10K 30/87* (2023.02);
(Continued)

(58) Field of Classification Search
CPC ........ H10K 39/32; H10K 19/20; H10K 30/30; H10K 30/87; H10K 85/113; H10K 85/115;
(Continued)

(56) References Cited

U.S. PATENT DOCUMENTS

2004/0085598 A1   5/2004   Kokeguchi et al.
2011/0114174 A1   5/2011   Rennig et al.
(Continued)

FOREIGN PATENT DOCUMENTS

JP   2004-134933 A   4/2004
JP   2010-537417     12/2010
(Continued)

OTHER PUBLICATIONS

International Search Report of PCT application No. PCT/JP2020/011109 dated Jun. 9, 2020.
(Continued)

*Primary Examiner* — Mohammad A Rahman
(74) *Attorney, Agent, or Firm* — Rimon P.C.

(57) ABSTRACT

An imaging device includes: a semiconductor substrate; pixel electrodes located above the semiconductor substrate and each electrically connected to the semiconductor substrate; a counter electrode located above the pixel electrodes; a first photoelectric conversion layer located between the counter electrode and the pixel electrodes; and at least one first light-shielding body located in or above the first photoelectric conversion layer. The first photoelectric conversion layer contains a semiconducting carbon nanotube that absorbs light in a first wavelength range and an organic molecule that covers the semiconducting carbon nanotube, absorbs light in a second wavelength range, and emits fluorescence in a third wavelength range. The at least one
(Continued)

first light-shielding body absorbs or reflects light with a wavelength in at least part of the second wavelength range.

20 Claims, 14 Drawing Sheets

(51) Int. Cl.
  *H10K 30/30* (2023.01)
  *H10K 30/87* (2023.01)
  *H10K 85/10* (2023.01)
  *H10K 85/20* (2023.01)

(52) U.S. Cl.
  CPC ......... *H10K 85/113* (2023.02); *H10K 85/115* (2023.02); *H10K 85/221* (2023.02)

(58) Field of Classification Search
  CPC ... H10K 85/221; Y02E 10/549; H01L 27/146; H01L 31/0248; H01L 31/08; H01L 31/10; H01L 2924/12043; H01L 31/1013; H01L 31/1016; H01L 31/145–153; H01L 31/165–173; H01L 31/0256–03365; H01L 31/1804–1856; H01L 31/028–0288; H01L 31/0312–03125; H01L 31/0296–02966; H01L 31/1828–1836; H01L 31/0304–03048; H01L 31/184–1856; H01L 31/032–0327; H01L 31/0328–03365; H01L 31/20–208; H01L 31/02005; H01L 31/02024–0203; H01L 31/02162–02165; H01L 27/142; H01L 27/14607; H01L 27/1461; H01L 27/14643; H01L 27/14665; G09G 2300/0452

See application file for complete search history.

(56) References Cited

U.S. PATENT DOCUMENTS

| | | | |
|---|---|---|---|
| 2016/0247860 A1 | 8/2016 | Ito et al. | |
| 2018/0047788 A1* | 2/2018 | Nozawa | H10K 30/353 |
| 2021/0082989 A1* | 3/2021 | Saito | H10K 19/20 |

FOREIGN PATENT DOCUMENTS

| | | |
|---|---|---|
| JP | 2011-119687 | 6/2011 |
| JP | 2011-520262 | 7/2011 |
| JP | 2011-520263 | 7/2011 |
| JP | 2015-153949 | 8/2015 |
| JP | 2016-157744 A | 9/2016 |
| JP | 2017-201695 | 11/2017 |
| WO | 2010/036397 | 4/2010 |
| WO | 2010/036398 | 4/2010 |

OTHER PUBLICATIONS

Christian Stelling et al., "Plasmonic nanomeshes: their ambivalent role as transparent electrodes in organic solar cells", Scientific Reports, 7, 42530, Feb. 15, 2017.

Sang-Yong Ju et al., "Brightly Fluorescent Single-Walled Carbon Nanotubes via an Oxygen-Excluding Surfactant Organization", Science vol. 323, American Association for the Advancement of Science, Mar. 6, 2009, pp. 1319-1323.

* cited by examiner

IMAGING DEVICE

BACKGROUND

1. Technical Field

The present disclosure relates to an imaging device.

2. Description of the Related Art

A photoelectric conversion material can absorb light, and the light absorbed by the photoelectric conversion material is converted to electric charges. The converted charges can be outputted as signal charges to the outside through, for example, electrodes to which a voltage is applied. One known photoelectric conversion material is a photoelectric conversion layer using carbon nanotubes. For example, Japanese Patent No. 5453396 discloses a photovoltaic device including an electron acceptor-type organic semiconductor and carbon nanotubes coated with a photoactive polymer. The photoactive polymer-coated carbon nanotubes generate excitons when irradiated with light in the wavelength range of about 400 nm to about 1500 nm.

Carbon nanotubes include single-walled carbon nanotubes each composed of a single graphene sheet and multi-walled carbon nanotubes each composed of a plurality of graphene sheets. The single-walled carbon nanotubes are more suitable for the photoelectric conversion materials than the multi-walled carbon nanotubes. In the present specification, the carbon nanotubes refer to single-walled carbon nanotubes, unless otherwise specified.

SUMMARY

In one general aspect, the techniques disclosed here feature an imaging device including: a semiconductor substrate; pixel electrodes located above the semiconductor substrate and each electrically connected to the semiconductor substrate; a counter electrode located above the pixel electrodes; a first photoelectric conversion layer located between the counter electrode and the pixel electrodes; and at least one first light-shielding body located in or above the first photoelectric conversion layer. The first photoelectric conversion layer contains a semiconducting carbon nanotube having a property of absorbing light in a first wavelength range and an organic molecule that covers the semiconducting carbon nanotube and that has a property of absorbing light in a second wavelength range and emitting fluorescence in a third wavelength range. The at least one first light-shielding body absorbs or reflects light with a wavelength in at least part of the second wavelength range.

In another general aspect, the techniques disclosed here feature an imaging device including: a semiconductor substrate; pixel electrodes located above the semiconductor substrate and each electrically connected to the semiconductor substrate; a counter electrode located above the pixel electrodes; a first photoelectric conversion layer located between the counter electrode and the pixel electrodes; and at least one second light-shielding body located in the first photoelectric conversion layer or between the first photoelectric conversion layer and the pixel electrodes. The first photoelectric conversion layer contains a semiconducting carbon nanotube having a property of absorbing light in a first wavelength range and an organic molecule that covers the semiconducting carbon nanotube and that has a property of absorbing light in a second wavelength range and emitting fluorescence in a third wavelength range. The at least one second light-shielding body absorbs or reflects light with a wavelength in at least part of the third wavelength range.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1A:
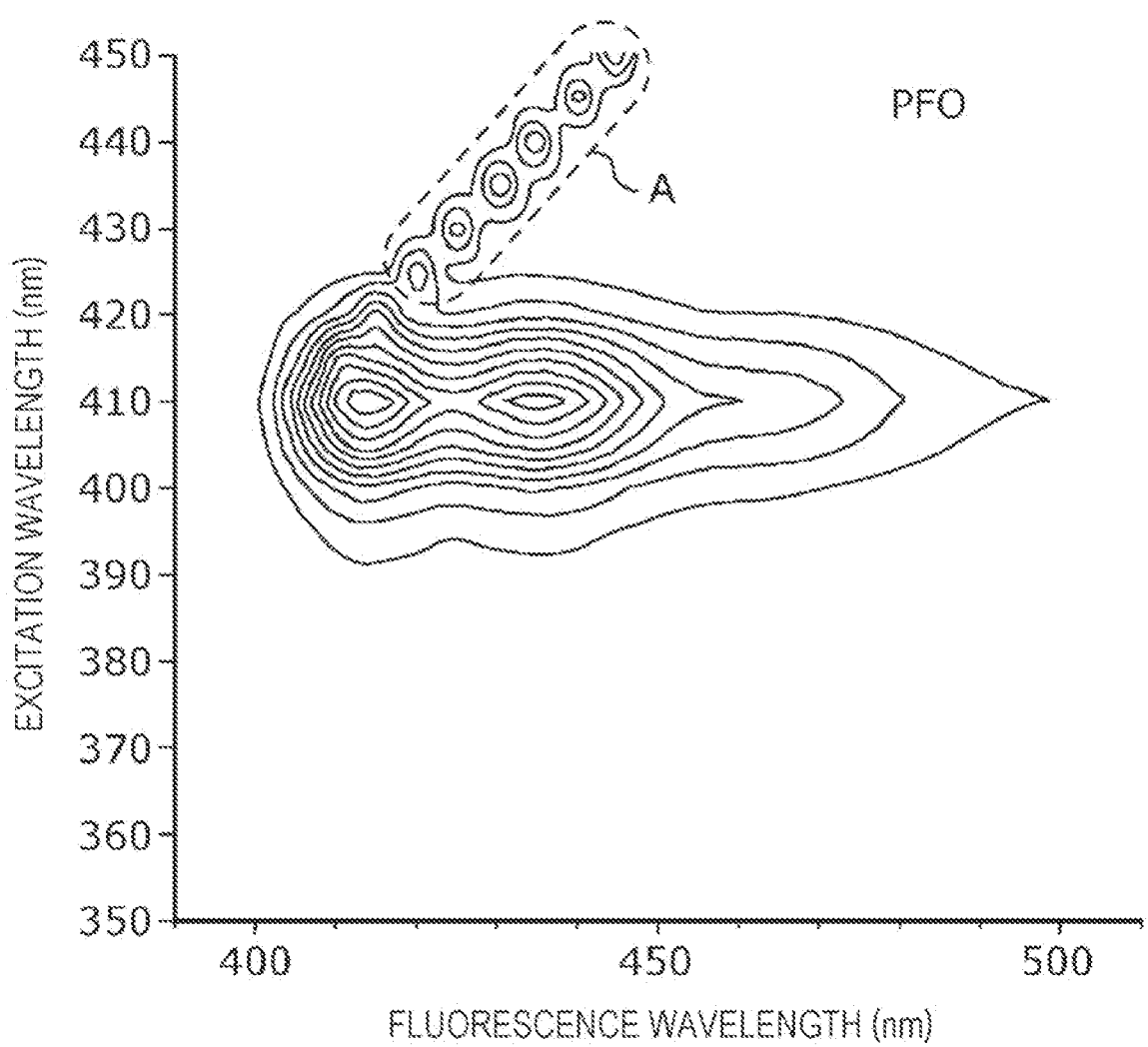
FIG. 1A is a graph showing an example of the absorption spectrum and the fluorescence spectrum of a semiconducting polymer.

DETAILED DESCRIPTION (Underlying Knowledge Forming Basis of Embodiments of Present Disclosure)

Semiconducting carbon nanotubes themselves can be used as a donor material for a photoelectric conversion material. For example, when semiconducting carbon nanotubes are used for a photoelectric conversion layer, a dispersion containing the semiconducting carbon nanotubes dispersed therein is applied to an electrode etc. However, when a dispersion containing only the semiconducting carbon nanotubes dispersed therein is applied to the electrode etc., it is difficult to apply the dispersion because the semiconducting carbon nanotubes are likely to aggregate.

By mixing a semiconducting polymer with the semiconducting carbon nanotubes, the aggregation of the carbon nanotubes in the dispersion is prevented, and the dispersion can be easily applied. Moreover, by mixing the semiconducting polymer with the semiconducting carbon nanotubes, the occurrence of contact between the semiconducting carbon nanotubes is reduced, and photoelectric conversion efficiency is improved.

Moreover, a certain type of semiconducting polymer can selectively extract semiconducting carbon nanotubes from a mixture of metallic carbon nanotubes and the semiconducting carbon nanotubes.

With a general method for producing carbon nanotubes, semiconducting carbon nanotubes and metallic carbon nanotubes are produced at a ratio of about 2:1. However, the metallic carbon nanotubes do not function as a donor material for a photoelectric conversion material. Moreover, the metallic carbon nanotubes have the undesirable effect of causing charges generated by the semiconducting carbon nanotubes upon absorption of light to disappear. Therefore, when the semiconducting carbon nanotubes are used as a donor material for a photoelectric conversion layer, the ratio of the metallic carbon nanotubes is reduced as much as possible to reduce the extent of disappearance of charges. From this point of view also, the use of the semiconducting polymer having the function of selectively extracting semiconducting carbon nanotubes is effective.

As described above, a plurality of advantages are obtained by using a mixture of the semiconducting carbon nanotubes and the semiconducting polymer.

The above advantages are obtained mainly by coating the semiconducting carbon nanotubes with the semiconducting polymer. However, it is difficult to completely remove only the semiconducting polymer not covering the semiconducting carbon nanotubes from the mixture of the semiconducting carbon nanotubes and the semiconducting polymer. Therefore, the mixture of the semiconducting carbon nanotubes and the semiconducting polymer generally contains the semiconducting polymer not covering the semiconducting carbon nanotubes.

When semiconducting carbon nanotubes are used for a photoelectric conversion layer, a mixture of the semiconducting carbon nanotubes and a semiconducting polymer may be used because of the above advantages. Examples of the semiconducting polymer suitable for coating the semiconducting carbon nanotubes include PFO (polyfluorene) that is a compound represented by the following structural formula (1) and PFO-BT (poly(fluorene-benzothiadiazole)) that is a compound represented by the following structural formula (2).

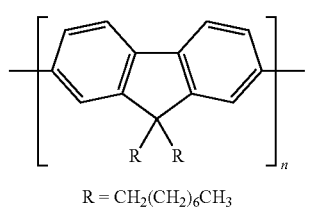

$R = CH_2(CH_2)_6CH_3$ (1)

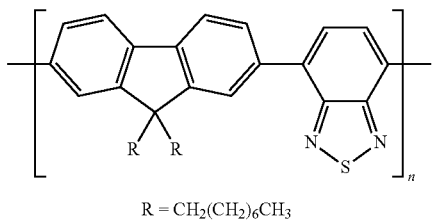

$R = CH_2(CH_2)_6CH_3$ (2)

Some types of low-molecular weight organic molecules have the function of coating the semiconducting carbon nanotubes to prevent aggregation of the semiconducting carbon nanotubes to thereby improve their dispersibility, as does the semiconducting polymer. Examples of the low-molecular weight organic molecules that can improve the dispersibility of the semiconducting carbon nanotubes include: flavin derivatives such as FC12 that is a compound represented by structural formula (3) below and FC60 that is a compound represented by structural formula (4) below; and pyrene derivatives.

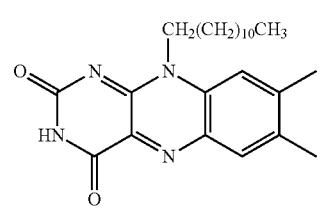

(3)

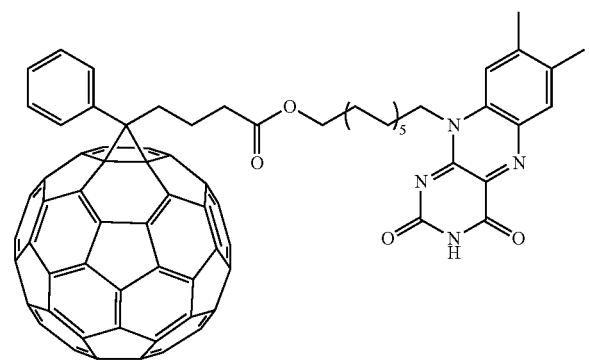

(4)

These semiconducting polymers and low-molecular weight organic molecules all have both a portion having the properties of π electrons having adsorbability onto semiconducting carbon nanotubes and a portion that increases solubility in a solvent. Organic molecules such as the above semiconducting polymers and the above low-molecular weight organic molecules have the function of improving dispersibility of the semiconducting carbon nanotubes in the photoelectric conversion layer. For example, in PFO, the six-membered rings in the fluorene skeleton have the properties of π electrons and have high adsorbability onto the semiconducting carbon nanotubes. For example, in FC12 and FC60, the six-membered rings in the flavin skeleton have the properties of π electrons and have high adsorbability onto the semiconducting carbon nanotubes. Similarly, the pyrene skeleton represented by structural formula (5) below is known to have high adsorbability onto the semiconducting carbon nanotubes.

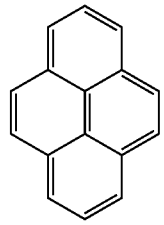

(5)

For example, the alkyl chains included in these semiconducting polymers and low-molecular weight organic molecules have high compatibility with a solvent and increase solubility of the semiconducting polymers and the low-molecular weight organic molecules in the solvent and their compatibility with the solvent.

As described above, these semiconducting polymers and low-molecular weight organic molecules are useful for dispersing the semiconducting carbon nanotubes. Specifically, the above-described organic molecules such as the semiconducting polymers and the low-molecular weight organic molecules can be used as a dispersant for the semiconducting carbon nanotubes. However, in the case where the photoelectric conversion layer is used for an optical sensor that is a final product, the semiconducting polymers and the low-molecular weight organic molecules often do not have a function important for photoelectric conversion, although they have the function of limiting contact between the semiconducting carbon nanotubes.

The present inventors have conducted studies on an imaging device including a photoelectric conversion layer in which semiconducting carbon nanotubes mixed with a semiconducting polymer are used as a donor material for a photoelectric conversion material. In the course of the studies, the inventors have found the following problem.

Many of the semiconducting polymers suitable for mixing with the semiconducting carbon nanotubes absorb light and then emit fluorescence. In particular, semiconducting polymers including fluorene or a similar structure as their polymer skeleton emit strong fluorescence in many cases. The light absorbed by the semiconducting polymers is short wavelength light ranging from blue light to ultraviolet light, but the wavelengths differ depending on the types of semiconducting polymers. The wavelengths of the fluorescence emitted from the semiconducting polymers are longer by about several tens of nm to about 100 nm than the wavelengths of the light absorbed and differ depending on the types of semiconducting polymers, and the fluorescence is in the visible wavelength range in many cases.

FIG. 1A is a graph showing the absorption spectrum and the fluorescence spectrum of a PFO thin film, which is an example of the semiconducting polymer. Specifically, FIG. 1A shows the spectra measured in the fluorescence wavelength range of from 390 nm to 510 nm at excitation wavelengths changed from 350 nm to 450 nm in steps of 5 nm. In the spectrum shown in FIG. 1A, the vertical axis represents the excitation wavelength, and the horizontal axis represents the fluorescence wavelength. Each contour is obtained by connecting pairs of excitation and fluorescence wavelengths with the same fluorescence intensity. In region A surrounded by a dotted line, the fluorescence wavelength and the excitation wavelength are the same. This is the result of the excitation wavelength entering a measurement device for measuring the fluorescence wavelength and does not mean a spectrum showing the fluorescence emitted from the PFO thin film.

As shown in FIG. 1A, the PFO thin film is excited by light in the wavelength range of about 390 nm to about 420 nm and emits fluorescence in the wavelength range of about 400 nm to about 500 nm. Specifically, the PFO thin film absorbs light in the wavelength range of about 390 nm to about 420 nm and emits fluorescence in the wavelength range of about 400 nm to about 500 nm.

Figure 1B:
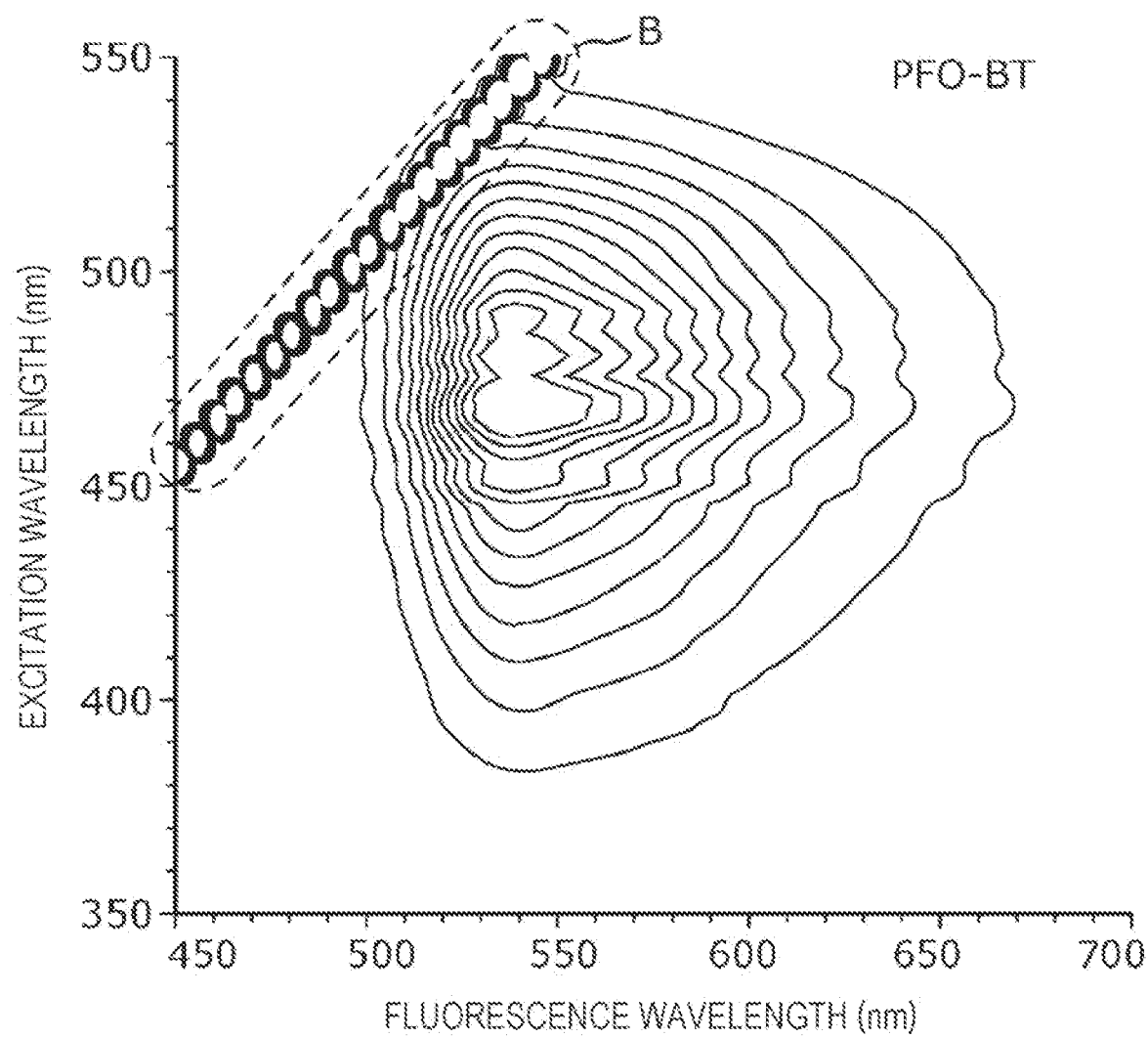
FIG. 1B is a graph showing another example of the absorption spectrum and the fluorescence spectrum of the semiconducting polymer.

FIG. 1B is a graph showing the absorption spectrum and the fluorescence spectrum of a PFO-BT thin film, which is another example of the semiconducting polymer. The spectra shown in FIG. 1B are spectra obtained by performing the same measurement as that in FIG. 1A on the PFO-BT thin film that is another semiconducting polymer. In FIG. 1B, as in FIG. 1A, the spectrum in region B surrounded by a dotted line is the result of the excitation wavelength entering the measurement device for measuring the fluorescence wavelength and does not mean a spectrum showing the fluorescence emitted from the PFO-BT thin film.

As shown in FIG. 1B, the PFO-BT thin film is excited by light in the wavelength range of about 390 nm to about 550 nm and emits fluorescence in the wavelength range of about 500 nm to about 660 nm. Specifically, the PFO-BT thin film absorbs light in the wavelength range of about 390 nm and about 550 nm and emits fluorescence in the wavelength range of about 500 nm and about 660 nm.

When the photoelectric conversion layer of the imaging device is irradiated with light, the donor material absorbs photons. The photons are converted to electric charges, and the electric charges are outputted to the outside as signal charges. When the photoelectric conversion layer contains the semiconducting polymer, the semiconducting polymer in the photoelectric conversion layer also absorbs photons and emits fluorescence isotropically. In this case, the fluorescence emitted from the semiconducting polymer in the photoelectric conversion layer is emitted also in directions different from the direction of the light applied to the imaging device. The fluorescence emitted from the semiconducting polymer is emitted from the photoelectric conversion layer isotropically. Therefore, in an imaging device including a photoelectric conversion layer disposed above a semiconductor substrate, a semiconductor layer in which charge storage regions, control circuits, etc. of the imaging device are formed can be irradiated with the fluorescence. For example, single-crystal silicon, which is the most commonly used material for the charge storage regions, the control circuits, etc., absorbs light in the wavelength range of about 200 nm to about 1100 nm. Therefore, when a semiconductor substrate containing silicon is used and irradiated with fluorescence in this wavelength range, the applied fluorescence may be absorbed by the charge storage regions and the control circuits in the semiconductor substrate. The wavelengths of fluorescence emitted from the typical semiconducting polymers shown in FIGS. 1A and 1B fall substantially within the absorption wavelength range of the semiconductor layer. For example, single-crystal gallium arsenide often used as the material of the charge storage regions, the control circuits, etc. absorbs light in the wavelength range of about 200 nm to about 800 nm. Therefore, when a semiconductor substrate containing gallium arsenide is used and irradiated with fluorescence in this wavelength range, the applied fluorescence may be absorbed by the charge storage regions and the control circuits in the semiconductor substrate.

When the photons of the fluorescence are absorbed by the charge storage regions, electric charges are generated in the charge storage regions. The electric charges generated by absorption of the fluorescence cannot be distinguished from electric charges generated when the donor material in the photoelectric conversion layer absorbs photons entering from the outside. Particularly problematic is absorption of the photons of fluorescence generated from the semiconducting polymer in the photoelectric conversion layer in a certain pixel by the charge storage region in another pixel. In this case, signal charges are generated at a position different from the position irradiated with the light, and this causes image blurring, color mixing, noise, etc. This problem arises because fluorescence is emitted from the semiconducting polymer in the photoelectric conversion layer in directions different from the direction of the light applied to the imaging device. Absorption of the fluorescence emitted from the semiconducting polymer in the photoelectric conversion layer by the control circuits also causes malfunction of the circuits and an increase in noise.

The present inventors have also found that the above problem is present also in low-molecular weight organic molecules used for the same purpose as the semiconducting polymer, i.e., used as a dispersant for the semiconducting carbon nanotubes. For example, with FC12, which is low-molecular weight organic molecules, as with the semiconducting polymers such as PFO, the effect of preventing aggregation and the effect of preventing contact between the semiconducting carbon nanotubes to thereby improving photoelectric conversion efficiency are obtained. The structure of FC12 is described in detail in Sang-Yong Ju et al., "Brightly Fluorescent Single-Walled Carbon Nanotubes via an Oxygen-Excluding Surfactant Organization," Science, American Association for the Advancement of Science, 2009, Vol. 323, pp. 1319-1323.

Figure 1C:
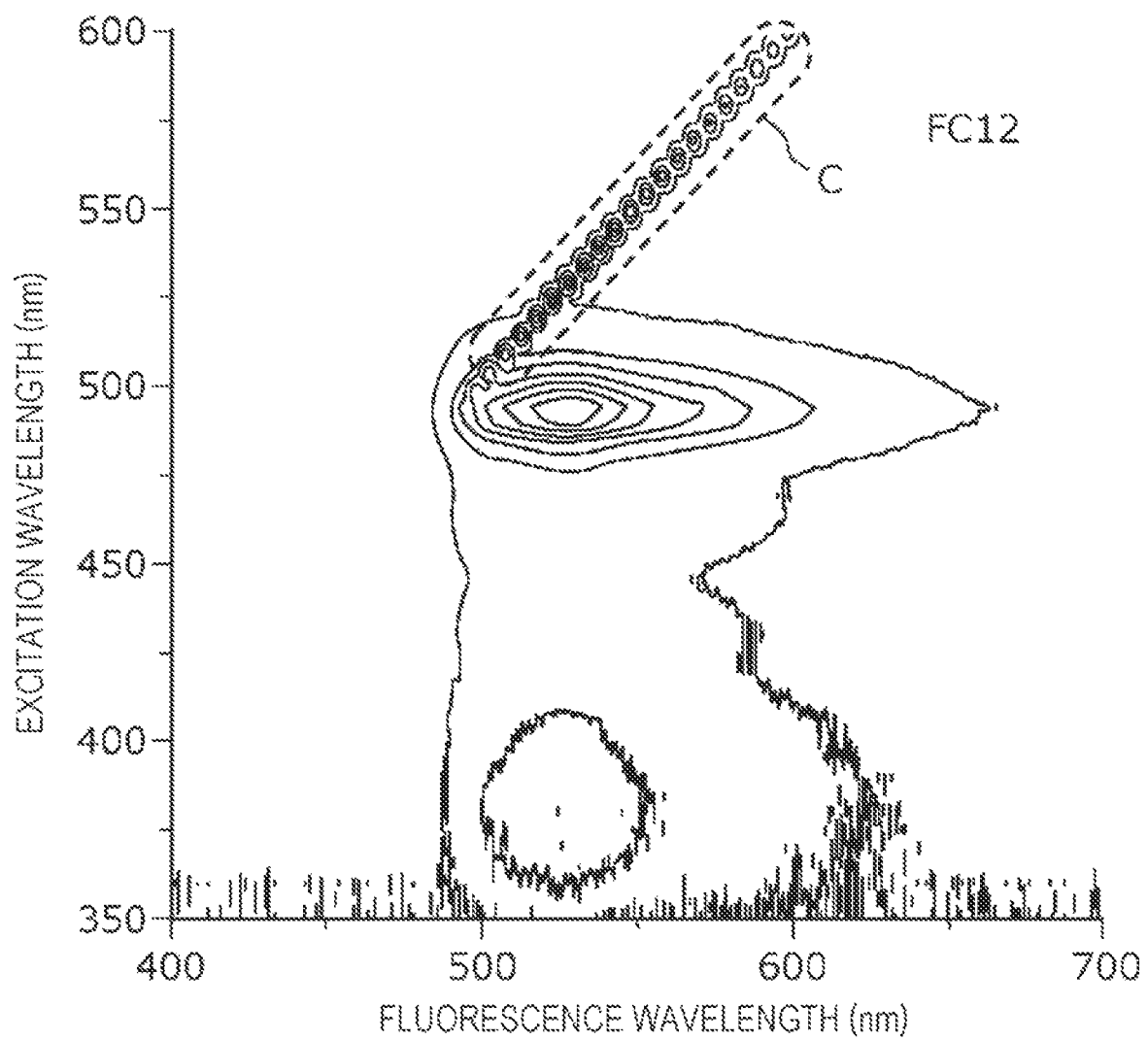
FIG. 1C is a graph showing an example of the absorption spectrum and the fluorescence spectrum of low-molecular weight organic molecules.

FIG. 1C is a graph showing the absorption spectrum and the fluorescence spectrum of an FC12 thin film, which is an example of the low-molecular weight organic molecules. The spectra shown in FIG. 1C are spectra obtained by performing the same measurement as that in FIG. 1A on the FC12 thin film. In FIG. 1C, as in FIG. 1A, the spectrum in region C surrounded by a dotted line is the result of the excitation wavelength entering the measurement device for measuring the fluorescence wavelength and does not mean a spectrum showing the fluorescence emitted from the FC12 thin film.

As shown in FIG. 1C, the FC12 thin film is excited by light in the wavelength range of about 350 nm to about 530 nm and emits fluorescence in the wavelength range of about 490 nm to about 680 nm. Specifically, the FC12 thin film absorbs light in the wavelength range of about 350 nm to about 530 nm and emits fluorescence in the wavelength range of about 490 nm to 680 nm. As shown in FIG. 1C, the wavelengths of the fluorescence emitted from the low-molecular weight organic molecule dispersant also fall within the absorption wavelength range of the semiconductor substrate.

As described above, the present inventors have found that, in the imaging device including the photoelectric conversion layer that is disposed above the semiconductor substrate and uses, as the donor material for the photoelectric conversion material, the semiconducting carbon nanotubes mixed with the organic molecules such as the semiconducting polymer or the low-molecular weight organic molecules, the fluorescence emitted from the organic molecule can cause an increase in noise in the imaging device. Accordingly, the present disclosure provides an imaging device with reduced noise. The noise is reduced even when the imaging device includes a photoelectric conversion layer that is disposed above a semiconductor substrate and uses, as a donor material for a photoelectric conversion material, semiconducting carbon nanotubes mixed with organic molecules.

Aspects of the present disclosure will be summarized below.

An imaging device according to one aspect of the present disclosure includes: a semiconductor substrate; pixel electrodes located above the semiconductor substrate and each electrically connected to the semiconductor substrate; a counter electrode located above the pixel electrodes; a first photoelectric conversion layer located between the counter electrode and the pixel electrodes; and at least one first light-shielding body located in or above the first photoelectric conversion layer. The first photoelectric conversion layer contains a semiconducting carbon nanotube having a property of absorbing light in a first wavelength range and an organic molecule that covers the semiconducting carbon nanotube and that has a property of absorbing light in a second wavelength range and emitting fluorescence in a third wavelength range. The at least one first light-shielding body absorbs or reflects light with a wavelength in at least part of the second wavelength range.

In this case, the first light-shielding body is located in the first photoelectric conversion layer or above the first photoelectric conversion layer. The phrase "located above the first photoelectric conversion layer" can be translated into the phrase "located on the light incident side of the first photoelectric conversion layer." Therefore, the light in the second wavelength range is absorbed or reflected by the first light-shielding body before the light in the second wavelength range reaches the organic molecule. In this manner, the amount of the light in the second wavelength range that is absorbed by the organic molecule can be reduced, so that the amount of fluorescence emitted from the organic molecule can be reduced. Therefore, the noise generated by absorption of the fluorescence emitted from the organic molecule by charge storage regions or control circuits that are formed from impurity regions etc. of the semiconductor substrate can be reduced. Specifically, the light in the second wavelength range is a cause of the noise in the imaging device, and the first light-shielding body reduces the amount of the light in the second wavelength range that reaches the organic molecule. Therefore, the imaging device with reduced noise is obtained.

For example, the at least one first light-shielding body may include an optical filter that is located above the counter electrode and that absorbs or reflects light with a wavelength in the at least part of the second wavelength range.

In this case, the optical filter is located on the counter electrode side of the first photoelectric conversion layer, i.e., on the light incident side of the imaging device that is away from the first photoelectric conversion layer. Therefore, the optical filter absorbs or reflects at least part of the light in the second wavelength range before the light reaches the first photoelectric conversion layer. In this manner, the amount of the light in the second wavelength range that reaches the organic molecule can be efficiently reduced, so that the noise in the imaging device is reduced.

For example, the at least one first light-shielding body may include a first charge transport layer that is located between the first photoelectric conversion layer and the counter electrode and that absorbs light with a wavelength in the at least part of the second wavelength range.

In this case, the first charge transport layer is located on the counter electrode side of the first photoelectric conversion layer, i.e., on the light incident side of the imaging device that is away from the first photoelectric conversion layer. Therefore, the first charge transport layer absorbs at least part of the light in the second wavelength range before the light reaches the first photoelectric conversion layer. Therefore, the amount of the light in the second wavelength range that reaches the organic molecule can be efficiently reduced, so that the noise in the imaging device is reduced.

For example, the at least one first light-shielding body may include a second photoelectric conversion layer that is located between the first photoelectric conversion layer and the counter electrode and that absorbs light with a wavelength in the at least part of the second wavelength range.

In this case, the second photoelectric conversion layer is located on the counter electrode side of the first photoelectric conversion layer, i.e., on the light incident side of the imaging device that is away from the first photoelectric conversion layer. Therefore, the second photoelectric conversion layer absorbs at least part of the light in the second wavelength range before the light reaches the first photoelectric conversion layer. Therefore, the amount of the light in the second wavelength range that reaches the organic molecule can be efficiently reduced, so that the noise in the imaging device is reduced.

For example, the at least one first light-shielding body may contain a first material that differs from the semiconducting carbon nanotube and that absorbs light with a wavelength in the at least part of the second wavelength range, and the first material may be located in the first photoelectric conversion layer.

In this case, since the first material is located in the first photoelectric conversion layer, the first material absorbs at least part of the light in the second wavelength range that has entered the first photoelectric conversion layer. Therefore, the amount of the light in the second wavelength range that reaches the organic molecule can be reduced, and the noise in the imaging device is reduced.

For example, the at least one first light-shielding body may transmit light with a wavelength in at least part of the first wavelength range.

In this case, the light in the first wavelength range can easily reach the semiconducting carbon nanotube, and therefore a reduction in the photoelectric conversion function in the first photoelectric conversion layer can be prevented.

For example, the imaging device may further include at least one second light-shielding body that is located in the first photoelectric conversion layer or between the first photoelectric conversion layer and the pixel electrodes and that absorbs or reflects light with a wavelength in at least part of the third wavelength range.

In this case, the second light-shielding body is located in the first photoelectric conversion layer or between the first photoelectric conversion layer and the pixel electrodes. Therefore, even when the organic molecule emits the fluorescence in the third wavelength range, the second light-shielding body absorbs or reflects the light in the third wavelength range. In this manner, the amount of the light in the third wavelength range that reaches the charge storage regions or the control circuits that are formed from the impurity regions etc. of the semiconductor substrate can be reduced. Specifically, the first light-shielding body reduces the amount of the light in the second wavelength range that reaches the organic molecule, and the second light-shielding body reduces the amount of the light in the third wavelength range that reaches the charge storage regions or the control circuits formed from the impurity regions etc. of the semiconductor substrate and that causes noise in the imaging device. Therefore, the noise in the imaging device obtained is further reduced.

An imaging device according to another aspect of the present disclosure includes: a semiconductor substrate; pixel electrodes located above the semiconductor substrate and each electrically connected to the semiconductor substrate; a counter electrode located above the pixel electrodes; a first photoelectric conversion layer located between the counter electrode and the pixel electrodes; and at least one second light-shielding body located in the first photoelectric conversion layer or between the first photoelectric conversion layer and the pixel electrodes. The first photoelectric conversion layer contains a semiconducting carbon nanotube having a property of absorbing light in a first wavelength range and an organic molecule that covers the semiconducting carbon nanotube and that has a property of absorbing light in a second wavelength range and emitting fluorescence in a third wavelength range. The at least one second light-shielding body absorbs or reflects light with a wavelength in at least part of the third wavelength range.

In this case, the second light-shielding body is located in the first photoelectric conversion layer or between the first photoelectric conversion layer and the pixel electrodes. Therefore, even when the organic molecule emits the fluorescence in the third wavelength range, the second light-shielding body absorbs or reflects the light in the third wavelength range. In this manner, the amount of the light in the third wavelength range that reaches the charge storage regions or the control circuits that are formed from the impurity regions etc. of the semiconductor substrate can be reduced. Specifically, the light in the third wavelength range is a cause of the noise in the imaging device, and the second light-shielding body reduces the amount of the light in the third wavelength range that reaches the charge storage regions or the control circuits that are formed from the impurity regions etc. of the semiconductor substrate. Therefore, the noise in the imaging device obtained is reduced.

For example, the at least one second light-shielding body may contain a second material that differs from the semiconducting carbon nanotube and that absorbs light with a wavelength in the at least part of the third wavelength range, and the second material may be located in the first photoelectric conversion layer.

In this case, since the second material is located in the first photoelectric conversion layer, the second material absorbs at least part of the fluorescence in the third wavelength range that is emitted from the organic molecule. Therefore, the amount of the light in the third wavelength range that reaches the charge storage regions or the control circuits that are formed from the impurity regions etc. of the semiconductor substrate can be reduced, so that the noise in the imaging device is reduced.

For example, the at least one second light-shielding body may include a second charge transport layer that is located between the first photoelectric conversion layer and the pixel electrodes and that absorbs light with a wavelength in the at least part of the third wavelength range.

In this case, the second charge transport layer is located on the pixel electrode side of the first photoelectric conversion layer, i.e., on the semiconductor substrate side of the first photoelectric conversion layer. Therefore, the second charge transport layer absorbs at least part of the light in the third wavelength range before the light reaches the semiconductor substrate. In this manner, the amount of the light in the third wavelength range that reaches the charge storage regions or the control circuits that are formed from the impurity regions etc. of the semiconductor substrate can be reduced, and therefore the noise in the imaging device is reduced.

For example, the organic molecule may include at least one selected from the group consisting of a semiconducting polymer and a low-molecular weight organic molecule.

In this case, the organic molecule including the semiconducting polymer or the low-molecular weight organic molecule or both can improve the dispersibility of the semiconducting carbon nanotube.

For example, the semiconducting polymer may be a polymer having a fluorene skeleton or a polymer having a thiophene skeleton.

In this case, the semiconducting carbon nanotube is efficiently coated with the semiconducting polymer, and the dispersibility of the semiconducting carbon nanotube in the first photoelectric conversion layer is improved, so that the photoelectric conversion efficiency is improved. Therefore, large signals are obtained, and the relative level of the noise in the imaging device obtained is reduced.

For example, the organic molecule may have a six-membered ring structure in the molecule.

In this case, the properties of π electrons that allow the organic molecule to adsorb easily onto the semiconducting carbon nanotube can be easily imparted to the organic molecule.

For example, the organic molecule may have, in the molecule, at least one selected from the group consisting of an alkyl chain having 4 or more carbon atoms and an alkylene chain having 4 or more carbon atoms.

In this case, the solubility of the organic molecule in a solvent is improved, so that the organic molecule allows the semiconducting carbon nanotube to be dispersed easily.

For example, the first photoelectric conversion layer may further contain a third material that functions as an acceptor for the semiconducting carbon nanotube.

In this case, electrons in hole-electron pairs generated in the semiconducting carbon nanotube transfer to the acceptor material. Therefore, recombination of the hole-electron pairs is reduced, and the photoelectric conversion efficiency of the first photoelectric conversion layer is improved.

For example, the first photoelectric conversion layer may further contain a third material that functions as an acceptor for the semiconducting carbon nanotube and the first material.

In this case, electrons in hole-electron pairs generated in the semiconducting carbon nanotube transfer to the acceptor material. Therefore, recombination of the hole-electron pairs is reduced, and the photoelectric conversion efficiency of the first photoelectric conversion layer is improved. Moreover, since electrons in hole-electron pairs generated by absorption of light by the first material transfer to the acceptor material, generation of energy by recombination of the hole-electron pairs is reduced.

For example, the first photoelectric conversion layer may further contain a third material that functions as an acceptor for the semiconducting carbon nanotube and the second material.

In this case, electrons in hole-electron pairs generated in the semiconducting carbon nanotube transfer to the acceptor material. Therefore, recombination of the hole-electron pairs is reduced, and the photoelectric conversion efficiency of the first photoelectric conversion layer is improved. Moreover, since electrons in hole-electron pairs generated by absorption of light by the second material transfer to the acceptor material, generation of energy by recombination of the hole-electron pairs is reduced.

For example, the semiconductor substrate may contain silicon.

In this case, even when the imaging device uses the semiconductor substrate containing silicon that can easily absorb the fluorescence emitted from the organic molecule, the noise in the imaging device is reduced.

Embodiments of the present disclosure will next be described with reference to the drawings.

The embodiments described below show general or specific examples. Numerical values, shapes, materials, components, arrangements and connections of the components, steps, the order of the steps, etc. shown in the following embodiments are merely examples and are not intended to limit the present disclosure. Among the components in the following embodiments, components not described in an independent claim will be described as optional components.

In the present specification, elements that are essential for the operation of the imaging device or effective in improving the characteristics thereof but are unnecessary for the description of the present disclosure are omitted. The drawings are schematic drawings, and scales, shapes, etc. are not taken into consideration at all. Therefore, the scales, for example, of the drawings are not necessarily the same. In the drawings, the same reference numerals are given to substantially the same components, and redundant description thereof will be omitted or simplified.

In the present specification, terms, such as equal, representing the relation between elements, terms, such as square and circular, representing the shapes of elements, and numerical ranges do not represent only their strict meanings but are intended to include those in substantially the same range, e.g., with a few percent difference.

In the present specification, the terms "above" and "below" do not refer to an upward direction (vertically above) and a downward direction (vertically below) in space recognition in an absolute manner but are used to define relative positional relations based on the stacking order in a stack structure. The terms "above" and "below" are used not only when two components are disposed with a space therebetween and another component is present between the two components but also when two components are disposed in contact with each other.

Embodiment 1

[Circuit Structure of Imaging Device]

First, the circuit structure of an imaging device according to an embodiment will be described using FIG. 2.

Figure 2:
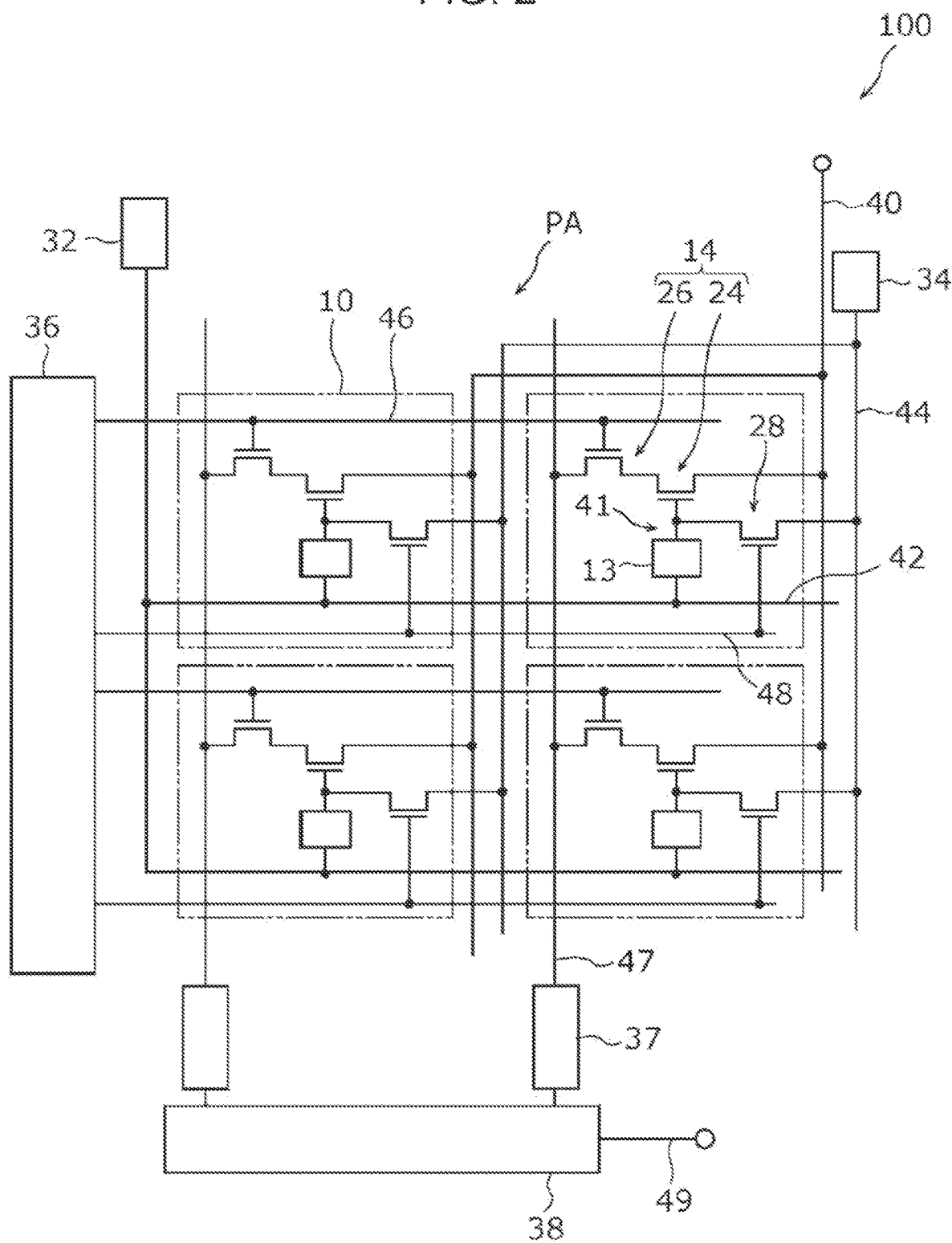
FIG. 2 is a circuit diagram showing the circuit structure of an imaging device according to embodiment 1.

FIG. 2 is a circuit diagram showing an exemplary circuit structure of the imaging device according to the present embodiment. The imaging device 100 shown in FIG. 2 includes a pixel array PA including a plurality of pixels 10 arranged two-dimensionally. FIG. 2 schematically shows an example in which the pixels 10 are arranged in a 2×2 matrix. The number of pixels 10 and the arrangement of the pixels 10 are not limited to those in the example shown in FIG. 2. For example, the imaging device 100 may be a line sensor including a plurality of pixels 10 arranged in a row.

Each of the pixels 10 includes a photoelectric conversion unit 13 and a signal detection circuit 14. The photoelectric conversion unit 13 generates a signal upon reception of incident light. It is unnecessary that the photoelectric conversion unit 13 be independent elements for the respective pixels 10, and a portion of the photoelectric conversion unit 13 may extend over a plurality of pixels 10. Each signal detection circuit 14 is a circuit that detects a signal generated by the photoelectric conversion unit 13. In this example, the signal detection circuit 14 includes a signal detection transistor 24 and an address transistor 26. The signal detection transistor 24 and the address transistor 26 are each typically a field-effect transistor (FET). In the present embodiment, an N channel MOSFET (Metal Oxide Semiconductor Field Effect Transistor) is exemplified as each of the signal detection transistor 24 and the address transistor 26. The transistors such as the signal detection transistor 24, the address transistor 26, and a reset transistor 28 described later each have a control terminal, an input terminal, and an output terminal. The control terminal is, for example, the gate. The input terminal is one of the drain and the source and is, for example, the drain. The output terminal is the other one of the drain and the source and is, for example, the source.

As schematically shown in FIG. 2, the control terminal of the signal detection transistor 24 is electrically connected to the photoelectric conversion unit 13. Signal charges generated by the photoelectric conversion unit 13 are stored in a charge storage node 41 between the gate of the signal detection transistor 24 and the photoelectric conversion unit 13. The signal charges are holes or electrons. The charge storage node is an example of a charge storage unit and is referred to as a "floating diffusion node." In the present specification, the charge storage node is referred to as a charge storage region. The details of the structure of the photoelectric conversion unit 13 will be described later.

In each pixel 10, a bias control line 42 is connected to the photoelectric conversion unit 13, and a prescribed voltage is applied to the photoelectric conversion unit 13. In the structure exemplified in FIG. 2, the bias control line 42 is connected to a voltage supply circuit 32.

Each pixel 10 is connected to a power line 40 that supplies a power voltage VDD. As shown in FIG. 2, the input terminal of the signal detection transistor 24 is connected to the power line 40. The power line 40 functions as a source follower power source, and the signal detection transistor 24 amplifies the signal generated by the photoelectric conversion unit 13 and outputs the amplified signal.

The input terminal of the address transistor 26 is connected to the output terminal of the signal detection transistor 24. The output terminal of the address transistor 26 is connected to one of a plurality of vertical signal lines 47 provided for respective rows of the pixel array PA. The control terminal of the address transistor 26 is connected to an address control line 46. By controlling the potential of the address control line 46, the output of the signal detection transistor 24 can be selectively read through the corresponding vertical signal line 47.

In the illustrated example, each address control line 46 is connected to a vertical scanning circuit 36. The vertical scanning circuit is referred to also as "column scanning circuit." The vertical scanning circuit 36 applies a prescribed voltage to each address control line 46 to select a plurality of pixels 10 arranged in a corresponding column. In this manner, signals from the selected pixels 10 are read, and the charge storage nodes 41 in the selected pixels 10 are reset.

The vertical signal lines 47 are main signal lines that transmit pixel signals from the pixel array PA to peripheral circuits. Column signal processing circuits 37 are connected to the vertical signal lines 47. The column signal processing circuits 37 are referred to also as "column signal storage circuits." The column signal processing circuits 37 perform noise limiting signal processing typified by correlated double sampling, analog-digital conversion, etc. As illustrated, the column signal processing circuits 37 are provided for their respective rows of the pixels 10 in the pixel array PA. A horizontal signal reading circuit 38 is connected to these column signal processing circuits 37. The horizontal signal reading circuit is referred to also as a "row scanning circuit." The horizontal signal reading circuit 38 reads signals from the plurality of column signal processing circuits 37 and outputs the signals to a horizontal common signal line 49 sequentially.

In the structure exemplified in FIG. 2, each pixel 10 includes a reset transistor 28. The reset transistor 28 is, for example, a field effect transistor, as are the signal detection transistor 24 and the address transistor 26. In an example described below, an N channel MOSFET is used as the reset transistor 28, unless otherwise specified. As illustrated, the reset transistor 28 is connected between a reset voltage line 44 that supplies a reset voltage Vr and the charge storage node 41. The control terminal of the reset transistor 28 is connected to a reset control line 48. By controlling the potential of the reset control line 48, the potential of the charge storage node 41 can be reset to the reset voltage Vr. In this example, the reset control line 48 is connected to the vertical scanning circuit 36. Therefore, when the vertical scanning circuit 36 applies a prescribed voltage to each reset control line 48, a plurality of pixels 10 disposed in a corresponding column can be reset.

In this example, the reset voltage lines 44 that supply the reset voltage Vr to the reset transistors 28 are connected to a reset voltage source 34. The reset voltage source is referred to also as a "reset voltage supply circuit." It is only necessary that the reset voltage source 34 have a structure that is capable of supplying the prescribed reset voltage Vr to the reset voltage lines 44 during operation of the imaging device 100, and the reset voltage source 34 is not limited to a specific power circuit, as is the voltage supply circuit 32 described above. The voltage supply circuit 32 and the reset voltage source 34 may each be part of a single voltage supply circuit or may be separate independent voltage supply circuits. One of or both the voltage supply circuit 32 and the reset voltage source 34 may be part of the vertical scanning circuit 36. Alternatively, the control voltage from the voltage supply circuit 32 and/or the reset voltage Vr from the reset voltage source 34 may be supplied to each pixel 10 through the vertical scanning circuit 36.

The power voltage VDD for the signal detection circuits 14 can be used as the reset voltage Vr. In this case, a common voltage source can be used as the reset voltage source 34 and a voltage supply circuit (not shown in FIG. 2) that supplies a power voltage to each pixel 10. In this case, since common lines can be used as the power lines 40 and the reset voltage lines 44, the wiring in the pixel array PA can be simplified. When different voltages are used as the reset voltage Vr and the power voltage VDD for the signal detection circuits 14, the imaging device 100 can be controlled more flexibly.

[Device Structure of Pixels]

Next, a cross-sectional structure of the plurality of pixels 10 of the imaging device 100 according to the present embodiment will be described using FIG. 3.

The imaging device 100 includes a first light-shielding body. The first light-shielding body absorbs or reflects light with wavelengths in at least part of the second wavelength range. The first light-shielding body is located in a first photoelectric conversion layer 15 or on a counter electrode 12 side of the first photoelectric conversion layer 15. The details of the first light-shielding body will be described later using various examples.

Figure 3:
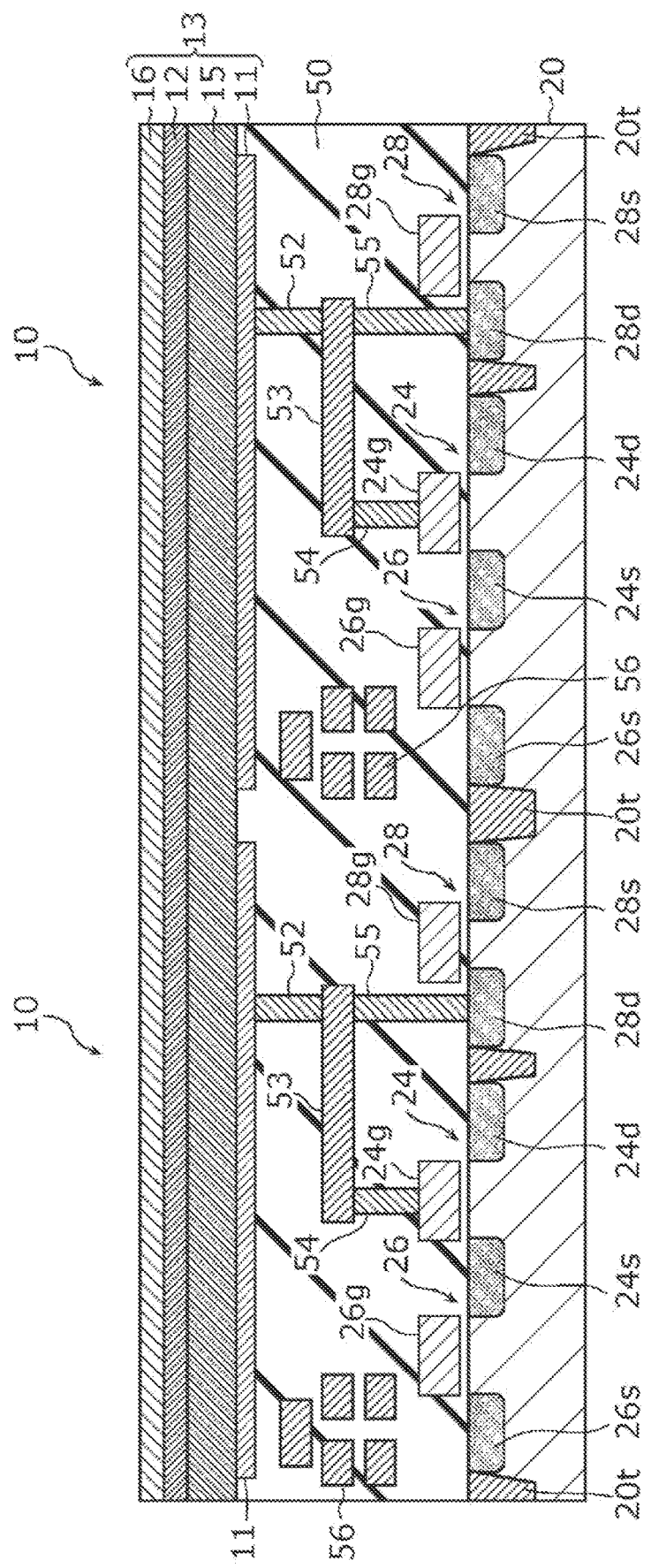
FIG. 3 is a schematic cross-sectional view showing a cross-sectional structure of a plurality of pixels in the imaging device according to embodiment 1.

FIG. 3 is a schematic cross-sectional view showing the cross-sectional structure of the plurality of pixels 10 of the imaging device 100 according to the present embodiment. The plurality of pixels 10 shown in FIG. 3 all have the same structure, but some of the plurality of pixels 10 may have a different structure. One pixel 10 of the plurality of pixels 10 will be described below. The imaging device 100 includes: a semiconductor substrate 20; a plurality of pixel electrodes 11 that are located above the semiconductor substrate 20 and each electrically connected to the semiconductor substrate 20; the counter electrode 12 located above the plurality of pixel electrodes 11; the first photoelectric conversion layer 15 located between the counter electrode 12 and the plurality of pixel electrodes 11; and an optical filter 16 located above the counter electrode 12. The first light-shielding body in the present embodiment includes the optical filter 16.

In the structure exemplified in FIG. 3, the above-described signal detection transistors 24, the address transistors 26, and the reset transistors 28 are formed on the semiconductor substrate 20. The semiconductor substrate 20 is not limited to a substrate formed entirely of a semiconductor. The semiconductor substrate 20 may be, for example, an insulating substrate having a semiconductor layer formed on the surface on the side on which a photosensitive region is to be formed. The semiconductor substrate 20 used is, for example, a semiconductor substrate containing silicon. In the example described below, a P-type silicon (Si) substrate is used as the semiconductor substrate 20. The semiconductor substrate 20 is not limited to the semiconductor substrate containing silicon and may be a different semiconductor substrate such as a semiconductor substrate containing gallium arsenide.

The semiconductor substrate 20 includes impurity regions 26s, 24s, 24d, 28d, and 28s and element isolation regions 20t for electrically isolating the pixels 10 from each other. The impurity regions 26s, 24s, 24d, 28d, and 28s are N-type regions. An element isolation region 20t is provided also between each impurity region 24d and a corresponding impurity region 28d. The element isolation regions 20t are formed, for example, by injecting acceptor ions under prescribed conditions.

The impurity regions 26s, 24s, 24d, 28d, and 28s are, for example, an impurity diffusion layer formed in the semiconductor substrate 20. As schematically illustrated in FIG. 3, each signal detection transistor 24 includes an impurity region 24s, an impurity region 24d, and a gate electrode 24g. The gate electrode 24g is formed using a conductive material. The conductive material is, for example, polysilicon having electrical conductivity imparted by impurity doping but may be a metal material. The impurity region 24s functions as, for example, a source region of the signal detection transistor 24. The impurity region 24d functions as, for example, a drain region of the signal detection transistor 24. A channel region of the signal detection transistor 24 is formed between the impurity region 24s and the impurity region 24d.

Similarly, each address transistor 26 includes an impurity region 26s, an impurity region 24s, and a gate electrode 26g. The gate electrode 26g is formed using a conductive material. The conductive material is, for example, polysilicon having electrical conductivity imparted by impurity doping but may be a metal material. The gate electrode 26g is connected to an address control line 46 not shown in FIG. 3. In this example, the signal detection transistor 24 and the address transistor 26 share the impurity region 24s and are thereby electrically connected to each other. The impurity region 24s functions as, for example, a drain region of the address transistor 26. The impurity region 26s functions as, for example, a source region of the address transistor 26. The impurity region 26s is connected to a vertical signal line 47 not shown in FIG. 3. The impurity region 24s may not be shared by the signal detection transistor 24 and the address transistor 26. Specifically, the source region of the signal detection transistor 24 and the drain region of the address transistor 26 may be separated from each other in the semiconductor substrate 20 and may be electrically connected to each other through a wiring layer disposed in an interlayer insulating layer 50.

Each reset transistor 28 includes impurity regions 28d and 28s and a gate electrode 28g. The gate electrode 28g is formed using, for example, a conductive material. The conductive material is, for example, polysilicon having electrical conductivity imparted by impurity doping but may be a metal material. The gate electrode 28g is connected to a reset control line 48 not shown in FIG. 3. The impurity region 28s function as, for example, a source region of the reset transistor 28. The impurity region 28s is connected to a reset voltage line 44 not shown in FIG. 3. The impurity region 28d functions as, for example, a drain region of the reset transistor 28.

The interlayer insulating layer 50 is disposed on the semiconductor substrate 20 so as to cover the signal detection transistors 24, the address transistors 26, and the reset transistors 28. The interlayer insulating layer 50 is formed of, for example, an insulating material such as silicon dioxide. As illustrated, a wiring layer 56 is disposed in the interlayer insulating layer 50. The wiring layer 56 is typically formed of a metal such as copper. The wiring layer 56 may include, as part thereof, signal lines such as the vertical signal lines 47 described above or power lines. The number of insulating layers in the interlayer insulating layer 50 and the number of layers included in the wiring layer 56 disposed in the interlayer insulating layer 50 can be freely set and are not limited to those in the example shown in FIG. 3.

As shown in FIG. 3, plugs 52, wiring lines 53, contact plugs 54, and contact plugs 55 are disposed in the interlayer insulating layer 50. The wiring lines 53 may be part of the wiring layer 56. The plugs 52, the wiring lines 53, the contact plugs 54, and the contact plugs 55 are each formed using a conductive material. For example, the plugs 52 and the wiring lines 53 are formed of a metal such as copper. The contact plugs 54 and 55 are formed, for example, of polysilicon having electrical conductivity imparted by impurity doping. The plugs 52, the wiring lines 53, the contact plugs 54, and the contact plugs 55 may be formed using the same material or may be formed using different materials.

The plugs 52, the wiring lines 53, and the contact plugs 54 form at least part of the charge storage nodes 41 between the photoelectric conversion unit 13 and the signal detection transistors 24. In the structure exemplified in FIG. 3, the gate electrode 24g of each signal detection transistor 24, a corresponding plug 52, a corresponding wiring line 53, a corresponding contact plug 54, a corresponding contact plug 55, and a corresponding impurity region 28d that is one of the source and drain regions of a corresponding reset transistor 28 function as a charge storage region for storing signal charges collected by a corresponding pixel electrode 11 in the photoelectric conversion unit 13.

Specifically, the pixel electrode 11 in the photoelectric conversion unit 13 is connected to the gate electrode 24g of the signal detection transistor 24 through the plug 52, the wiring line 53, and the contact plug 54. In other word, the gate of the signal detection transistor 24 is electrically connected to the pixel electrode 11. The pixel electrode 11 is also connected to the impurity region 28d through the plug 52, the wiring line 53, and the contact plug 55.

When signal charges are collected by the pixel electrode 11, a voltage corresponding to the amount of the signal charges stored in the charge storage region is applied to the gate of the signal detection transistor 24. The signal detection transistor 24 amplifies this voltage. The voltage amplified by the signal detection transistor 24 is selectively read as a signal voltage through the address transistor 26.

The photoelectric conversion unit 13 described above is disposed on the interlayer insulating layer 50. When the semiconductor substrate 20 is viewed in plan, the plurality of two-dimensionally arranged pixels 10 form a photosensitive region. The photosensitive region is referred to also as a pixel region. The distance between two adjacent pixels 10, i.e., the pixel pitch, may be, for example, about 2 μm.

[Structure of Photoelectric Conversion Unit]

A specific structure of the photoelectric conversion unit 13 will next be described.

As shown in FIG. 3, the photoelectric conversion unit 13 includes: the plurality of pixel electrodes 11, the counter electrode 12, and the first photoelectric conversion layer 15 disposed between the counter electrode 12 and the plurality of pixel electrodes 11. The optical filter 16 is disposed on the counter electrode 12 in the photoelectric conversion unit 13. In the present embodiment, the optical filter 16, the counter electrode 12, the first photoelectric conversion layer 15, and the plurality of pixel electrodes 11 are disposed in this order from the light incident side of the imaging device 100. Specifically, the optical filter 16 is disposed on the light incident side of the first photoelectric conversion layer 15.

The photoelectric conversion unit 13 may further include other elements such as an electron blocking layer and a hole blocking layer.

In the example shown in FIG. 3, the counter electrode 12, the first photoelectric conversion layer 15, and the optical filter 16 are formed so as to extend over the plurality of pixels 10. The pixel electrodes 11 are provided for the respective pixels 10. Each pixel electrode 11 is spatially separated from the pixel electrode 11 of an adjacent pixel 10 and is thereby electrically isolated from the pixel electrode 11 of the adjacent pixel 10. At least one of the counter electrode 12, the first photoelectric conversion layer 15, or the optical filter 16 may be divided and disposed for each of the pixels 10.

The pixel electrodes 11 are electrodes for reading signal charges generated in the photoelectric conversion unit 13. At least one pixel electrode 11 is provided for each pixel 10. Each pixel electrode 11 is electrically connected to the gate electrode 24g of a corresponding signal detection transistor 24 and a corresponding impurity region 28d.

The pixel electrodes 11 are formed using a conductive material. The conductive material is, for example, a metal such as aluminum or copper, a metal nitride, or a polysilicon having electrical conductivity imparted by impurity doping.

The counter electrode 12 is, for example, a transparent electrode formed of a transparent conductive material. The counter electrode 12 is disposed on the light incident side of the first photoelectric conversion layer 15. Therefore, light passing through the counter electrode 12 is incident on the first photoelectric conversion layer 15. The light detected by the imaging device 100 is not limited to light in the wavelength range of visible light. For example, the imaging device 100 may detect infrared or ultraviolet rays. The wavelength range of the visible light is, for example, equal to or longer than 380 nm and equal to or shorter than 780 nm.

The term "transparent" as used herein means that at least part of light in the wavelength range to be detected is allowed to pass through, and it is not essential that the light in the entire wavelength range of visible light be allowed to pass through. In the present specification, electromagnetic waves in general including infrared rays and ultraviolet rays are referred to as "light" for convenience.

The counter electrode 12 is formed using a transparent conducting oxide (TCO) such as ITO, IZO, AZO, FTO, $SnO_2$, $TiO_2$, or $ZnO_2$. The voltage supply circuit 32 shown in FIG. 2 is connected to the counter electrode 12. By controlling the voltage applied to the counter electrode 12 from the voltage supply circuit 32, the potential difference between the counter electrode 12 and the pixel electrodes 11 can be set to a desired potential difference and maintained.

As described with reference to FIG. 2, the counter electrode 12 is connected to the bias control lines 42 connected to the voltage supply circuit 32. The counter electrode 12 is formed so as to extend over the plurality of pixels 10. Therefore, a desired control voltage can be applied to the plurality of pixels 10 simultaneously from the voltage supply circuit 32 through the bias control lines 42. Separate counter electrodes 12 may be provided for the respective pixels 10 so long as the desired control voltage can be applied from the voltage supply circuit 32.

The voltage supply circuit 32 controls the potential of the counter electrode 12 relative to the potential of the pixel electrodes 11, and this allows the pixel electrodes 11 to collect holes or electrons in hole-electron pairs generated in the first photoelectric conversion layer 15 as signal charges. When, for example, holes are used as the signal charges, the potential of the counter electrode 12 is set to be higher than the potential of the pixel electrodes 11, and this allows the pixel electrodes 11 to collect the holes selectively. In the following example, holes are used as the signal charges. Of course, electrons can be used as the signal charges. In this case, the potential of the counter electrode 12 is set to be lower than the potential of the pixel electrodes 11. When an appropriate bias voltage is applied between the counter electrode 12 and the pixel electrodes 11, the pixel electrodes 11 facing the counter electrode 12 collect positive or negative charges generated by photoelectric conversion in the first photoelectric conversion layer 15.

The first photoelectric conversion layer 15 is a layer that absorbs photons and generates photo-charges. Specifically, the first photoelectric conversion layer 15 generates hole-electron pairs upon reception of incident light. Therefore, the signal charges are holes or electrons. In the example described in the present embodiment, the signal charges are holes. However, the signal charges may be electrons. Holes serving as the signal charges are collected by the pixel electrodes 11. Electrons having a polarity opposite to the polarity of the signal charges are collected by the counter electrode 12.

The first photoelectric conversion layer 15 contains semiconducting carbon nanotubes, organic molecules, and an acceptor material. The first photoelectric conversion layer 15 contains, for example, the semiconducting carbon nanotubes, the acceptor material, and the organic molecules covering the semiconducting carbon nanotubes. The acceptor material is an example of the third material. The first photoelectric conversion layer 15 may not contain the acceptor material.

The semiconducting carbon nanotubes generate hole-electron pairs upon reception of incident light. The semiconducting carbon nanotubes function as, for example, a donor for the acceptor material. Specifically, the semiconducting carbon nanotubes donate electrons to the acceptor material. The semiconducting carbon nanotubes may donate electrons directly to the pixel electrodes 11 or the counter electrode 12.

Figure 4:
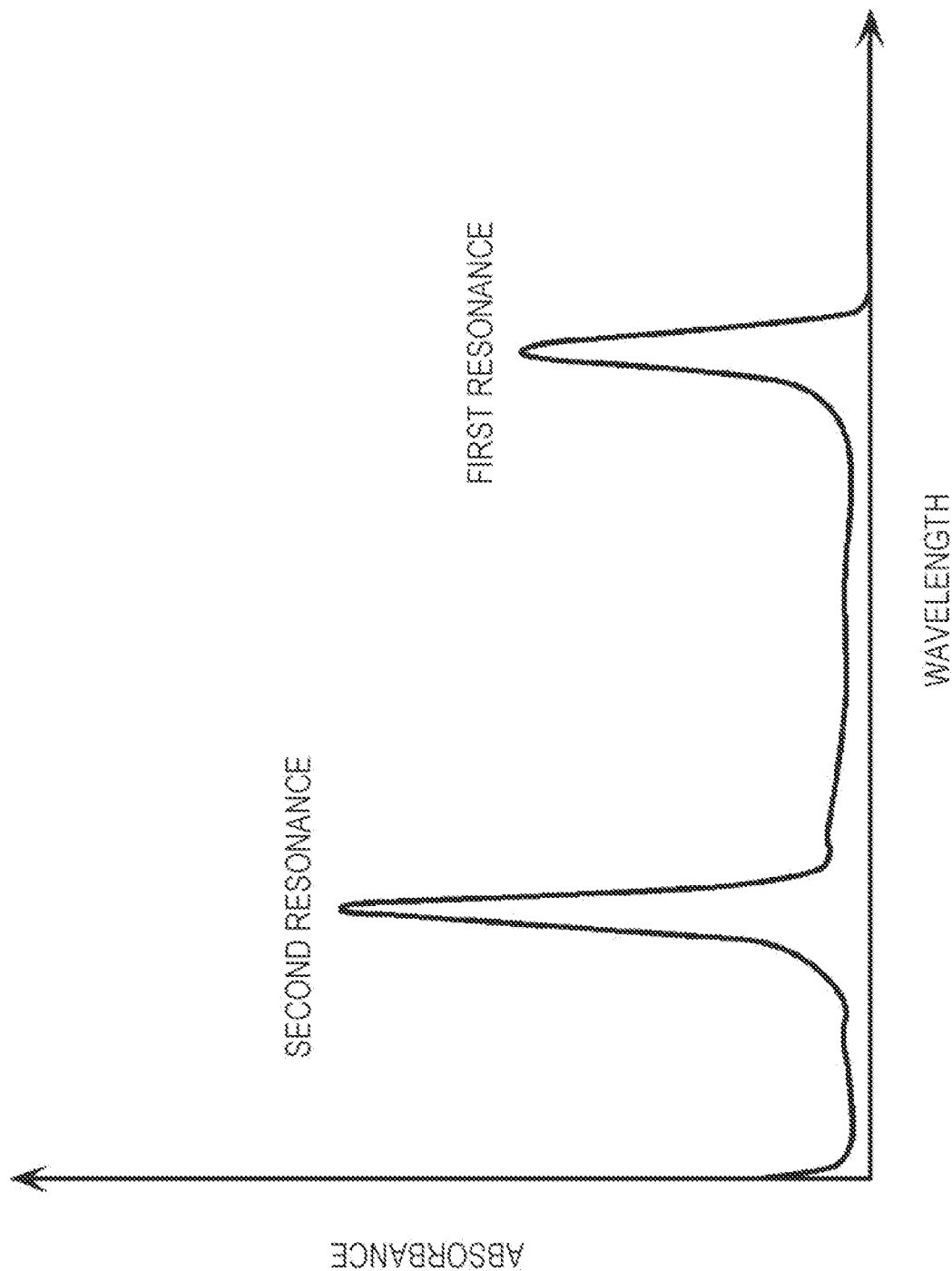
FIG. 4 is a schematic illustration showing an example of the absorption spectrum of semiconducting carbon nanotubes.

The semiconducting carbon nanotubes have the property of absorbing light in a first wavelength range. FIG. 4 is a schematic illustration showing an example of the absorption spectrum of the semiconducting carbon nanotubes. As shown in FIG. 4, the semiconducting carbon nanotubes have a plurality of light absorption peaks. The plurality of light absorption peaks are due to resonance of the semiconducting carbon nanotubes. The plurality of light absorption peaks are referred to as first resonance, second resonance, and so on in descending order of wavelength.

The resonance wavelengths of the semiconducting carbon nanotubes differ depending on the type of semiconducting carbon nanotubes. The type of semiconducting carbon nanotubes is specified by two integers called chirality.

For example, (7,5) type semiconducting carbon nanotubes have a first resonance wavelength of about 1047 nm and a second resonance wavelength of about 620 nm. (9,8) type semiconducting carbon nanotubes have a first resonance wavelength of about 1450 nm and a second resonance wavelength of about 803 nm. The wavelengths of the light absorption peaks may vary about several tens of nm depending on, for example, the type of organic molecules used for coating.

The first wavelength range is a wavelength range in which the semiconducting carbon nanotubes absorb light and generate photo-charges, as at the first resonance and second resonance wavelengths shown in FIG. 4. Specifically, the first wavelength range is a wavelength range in which the semiconducting carbon nanotubes exhibit significant quantum efficiency. For example, the first wavelength range is a wavelength range in which the light absorptance of the semiconducting carbon nanotubes is equal to or more than 1%.

As described above, the semiconducting carbon nanotubes absorb light in specific narrow wavelength ranges. Therefore, with the first photoelectric conversion layer 15 using the semiconducting carbon nanotubes, narrow wavelength band imaging can be performed. In particular, when the semiconducting carbon nanotubes having the chirality described above and absorbing light in a narrow wavelength range in the infrared wavelength range are used, high sensitivity imaging can be performed using, for example, infrared wavelengths.

The first photoelectric conversion layer 15 may contain a plurality of types of semiconducting carbon nanotubes with different chiralities. The first photoelectric conversion layer 15 may further contain a material that functions as a donor for the acceptor material, in addition to the semiconducting carbon nanotubes.

The acceptor material functions as an acceptor for the semiconducting carbon nanotubes. Specifically, the acceptor material accepts electrons from the semiconducting carbon nanotubes. Therefore, electrons transfer from hole-electron pairs generated in the semiconducting carbon nanotubes to the acceptor material. In this case, recombination of the hole-electron pairs is reduced, and the photoelectric conversion efficiency of the first photoelectric conversion layer 15 is improved.

Examples of the acceptor material used include C60 (fullerene) and C60 derivatives such as PCBM (phenyl-C61-butyric acid methyl ester) and ICBA (indene C60 bisadduct). The acceptor material is not limited to these materials, and any material capable of accepting electrons from the semiconducting carbon nanotubes as described above can be used as the acceptor material. One acceptor material may be used, or a combination of a plurality of acceptor materials may be used.

The organic molecules are an organic compound that covers the semiconducting carbon nanotubes. The organic molecules function as a dispersant for the semiconducting carbon nanotubes. The organic molecules have the property of absorbing light in a second wavelength range and emitting fluorescence in a third wavelength range. The organic molecules include, for example, a semiconducting polymer or low-molecular weight organic molecules or both.

The second wavelength range is a wavelength range in which the organic molecules exhibit significant absorption. Specifically, the second wavelength range is a wavelength range of light absorbed by the organic molecules in which the organic molecules absorb light and emit fluorescence to the extent that the operation of the imaging device 100 is affected to cause image blurring, color mixing noise, malfunctions, etc. For example, the second wavelength range is a wavelength range in which the light absorptance of the organic molecules is equal to or more than 1%. The third wavelength range is a wavelength range of the fluorescence generated when the organic molecules absorb light in the second wavelength range.

For example, when the organic molecules is PFO, which is an example of the semiconducting polymer, the organic molecules emit significant fluorescence when the organic molecules absorb light in the wavelength range of about 390 nm to about 420 nm, as shown in FIG. 1A. The second wavelength range depends on the absorption coefficient of the organic molecules, the probability of fluorescence emission, the thickness of the first photoelectric conversion layer 15, the imaging purpose of the image sensor, the imaging environment, etc. For example, the second wavelength range is a wavelength range in which the light absorptance of the organic molecules is equal to or more than 1%.

For example, the organic molecules have a six-membered structure in their molecule. In this case, the properties of $\pi$ electrons can be easily imparted to the organic molecules. Examples of the organic molecules having the six-membered structure include organic compounds having at least one of a fluorene skeleton, a benzothiazole skeleton, a flavin skeleton, or a pyrene skeleton. Moreover, for example, the organic molecules have, in their molecule, at least one of an alkyl chain or an alkylene chain. In this case, the solubility in a solvent is improved, so that the organic molecules improve the dispersibility of the semiconducting carbon nanotubes. From the viewpoint of improvement in solubility in a solvent, the number of carbon atoms in the alkyl chain and the alkylene chain may be equal to or more than 4 and may be equal to or more than 6. the alkyl chain and the alkylene chain may be linear or branched.

The semiconducting polymer is a polymer that covers the semiconducting carbon nanotubes. The semiconducting polymer has, for example, a repeating unit including a moiety having the properties of $\pi$ electrons. Examples of the semiconducting polymer used include $\pi$-electron conjugated polymers having a planar monomer skeleton such as polymers of fluorene, fluorene derivatives, thiophene, thiophene derivatives, and phenylenevinylene derivatives. The semiconducting polymer may be a copolymer containing any of the above monomers in an amount equal to or more than 50%. From the viewpoint of coating the semiconducting carbon nanotubes efficiently, the semiconducting polymer may be a polymer having a fluorene skeleton or a polymer having a thiophene skeleton. Specifically, the semiconducting polymer may be a polymer of fluorene, a fluorene derivative, thiophene, or a thiophene derivative. Specific examples of the semiconducting polymer used include PFO, PFO-BT, PT (polythiophene), and MDMO-PPV (poly[2-methoxy-5-(3',7'-dimethyloctyloxy)-1,4-phenylenevinylene]). Of these, PFO or PFO-BT may be used as the semiconducting polymer, from the viewpoint of efficiency of selection of the semiconducting carbon nanotubes.

The low-molecular weight organic molecules are a low-molecular weight compound that covers the semiconducting carbon nanotubes. The low-molecular weight organic molecules are composed of a low-molecular weight compound having a moiety having the properties of $\pi$ electrons and have a structure in which the low-molecular weight compound is not repeated as a repeating unit In their molecule. Examples of the low-molecular weight organic molecules include a low-molecular weight compound having a least one of a fluorene skeleton, a thiophene skeleton, a flavin skeleton, or a pyrene skeleton. Specific examples of the low-molecular weight compound include FC12 and FC60.

The optical filter 16 has a non-zero light reflectance or a non-zero light absorptance at wavelengths in at least part of the second wavelength range in which the organic molecules exhibit significant absorption. The optical filter 16 may have a non-zero light reflectance or a non-zero light absorptance at wavelengths including a wavelength at which the organic molecules exhibit the maximum light absorptance within the second wavelength range. The optical filter 16 may have a non-zero light reflectance or a non-zero light absorptance at all the wavelengths in the second wavelength range.

The optical filter 16 reflects or absorbs light in the second wavelength range to reduce the transmittance of light in the second wavelength range. In this manner, the amount of light absorbed by the organic molecules is reduced, and the amount of fluorescence emitted from the organic molecules is reduced.

The optical filter 16 may transmit substantially no light in the second wavelength range. The phrase "transmit substantially no light in the second wavelength range" means as follows. In the case where light passing through the optical filter 16 is absorbed by the organic molecules and the organic molecules emits fluorescence, although the fluorescence is absorbed by the charge storage regions, significant false signals are not generated, or the fluorescence does not cause a significant malfunction of the control circuits.

The transmittance of light in the second wavelength range through the optical filter 16 depends on the absorption coefficient of the organic molecules, the probability of fluorescence emission, the thickness of the first photoelectric conversion layer 15, the purpose of imaging by the imaging device 100, the imaging environment, etc. For example, the transmittance is set such that the light absorptance of the organic molecules is equal to or less than 1% at all the wavelengths in the second wavelength range. Specifically, the transmittance of light in the second wavelength range through the optical filter 16 may be equal to or less than 5% or may be equal to or less than 1%.

As described above, the optical filter 16 is located on the light incident side of the first photoelectric conversion layer 15 in the imaging device and absorbs or reflects at least part of light in the second wavelength range. This can reduce the amount of light in the second wavelength range that reaches the organic molecules. Therefore, the amount of fluorescence generated when the organic molecules are excited by the light in the second wavelength range can be reduced. Specifically, noise etc. that are generated when the charge storage regions etc. absorb fluorescence emitted from the organic molecules can be reduced.

The optical filter 16 transmits light with wavelengths in at least part of the first wavelength range. In other words, the optical filter 16 has significant transparency at light wavelengths in at least part of the first wavelength range. The phrase "significant transparency" means the transparency that allows imaging using light passing through the optical filter 16 and photoelectric-converted by the semiconducting carbon nanotubes. The transmittance of light in the first wavelength range through the optical filter 16 depends on imaging conditions, the purpose of imaging, etc. and is, for example, equal to or more than 50%.

When the semiconducting carbon nanotubes have a plurality of resonance wavelengths as shown in FIG. 4, the optical filter 16 may have significant transparency at any of the resonance wavelengths of the semiconducting carbon nanotubes. When the first photoelectric conversion layer 15 contains a plurality of types of semiconducting carbon nanotubes with different chiralities, the optical filter 16 may have significant transparency in any of the resonance wavelength ranges of the semiconducting carbon nanotubes with different chiralities.

As described above, the optical filter 16 transmits light with wavelengths in at least part of the first wavelength range, and therefore a reduction in the photoelectric conversion function in the first photoelectric conversion layer 15 can be prevented.

The optical filter 16 may be an absorption type filter using, for example, colored glass or may be a reflection type filter obtained by stacking a dielectric multilayer film.

Examples of the absorption type filter include colored glass RG715 manufactured by SCHOTT. The colored glass RG715 has the property of blocking light with wavelengths equal to or shorter than 700 nm and allowing light with wavelengths equal to or more than 800 nm to pass through. For example, when the colored glass RG715 is used as the optical filter 16, the optical filter 16 can block light with the second resonance wavelength of the (7,5) type semiconducting carbon nanotubes and can transmit light with the first resonance wavelength. When the colored glass RG715 is used as the optical filter 16, the optical filter 16 can transmit both the first resonance light and the second resonance light of the (9,8) type semiconducting carbon nanotubes.

When the colored glass RG715 is used as the optical filter 16, the optical filter 16 transmits substantially no light in the second wavelength range when the upper limit of the second wavelength range of the organic molecules is equal to or less than 700 nm as in the case of PFO or PFO-BT.

The above are merely examples, and an optical filter having characteristics appropriate for the absorption spectrum of the organic molecules and the absorption spectrum of the semiconducting carbon nanotubes may be selected.

The optical filter 16 may be, for example, a long pass filter that blocks light with wavelengths shorter than a certain wavelength and transmits light with wavelengths longer than the certain wavelength or may be a band pass filter that transmits only light in a certain wavelength range and blocks light with wavelengths shorter and longer than the certain wavelength range. For example, the transmission wavelength range of the band pass filter may be substantially the same as any of the resonance wavelengths of the semiconducting carbon nanotubes having chirality and used as a donor material.

The optical filter 16 may be, for example, a notch filter that blocks light in a wavelength range including the second wavelength range and transmits light with wavelengths shorter than the above wavelength range and light with wavelengths longer than the above wavelength range.

The optical filter 16 may be disposed immediately above the counter electrode 12 as shown in FIG. 3, may be disposed on a sealing film formed on the counter electrode 12 and not shown in FIG. 3, or may be disposed on glass attached to protect the imaging surface of the imaging device 100 and not shown in FIG. 3.

It is unnecessary that the optical filter 16 be disposed near the photoelectric conversion unit 13, and the optical filter 16 may be disposed in an optical path of the imaging system. For example, the optical filter 16 may be disposed between an imaging lens and the photoelectric conversion unit 13, in the imaging lens, or in front of the imaging lens.

The optical filter 16 may have the function of a sealing film for preventing transmission of oxygen and water vapor.

The optical filter 16 may be used together with, for example, an optical filter for multispectral imaging that is used to change imaging spectra for pixels. The optical filter for multispectral imaging may serve as the optical filter 16.

The optical filter 16 is not limited to a fixed filter. For example, the optical filter 16 may be replaceable with another optical filter, if necessary.

Embodiment 2

Next, embodiment 2 will be described. Embodiment 2 differs from embodiment 1 in that a first charge transport layer instead of the optical filter is used as the first light-shielding body. The difference from embodiment 1 will be mainly described, and the description of common features will be omitted or simplified.

[Structure of Photoelectric Conversion Unit]

Figure 5:
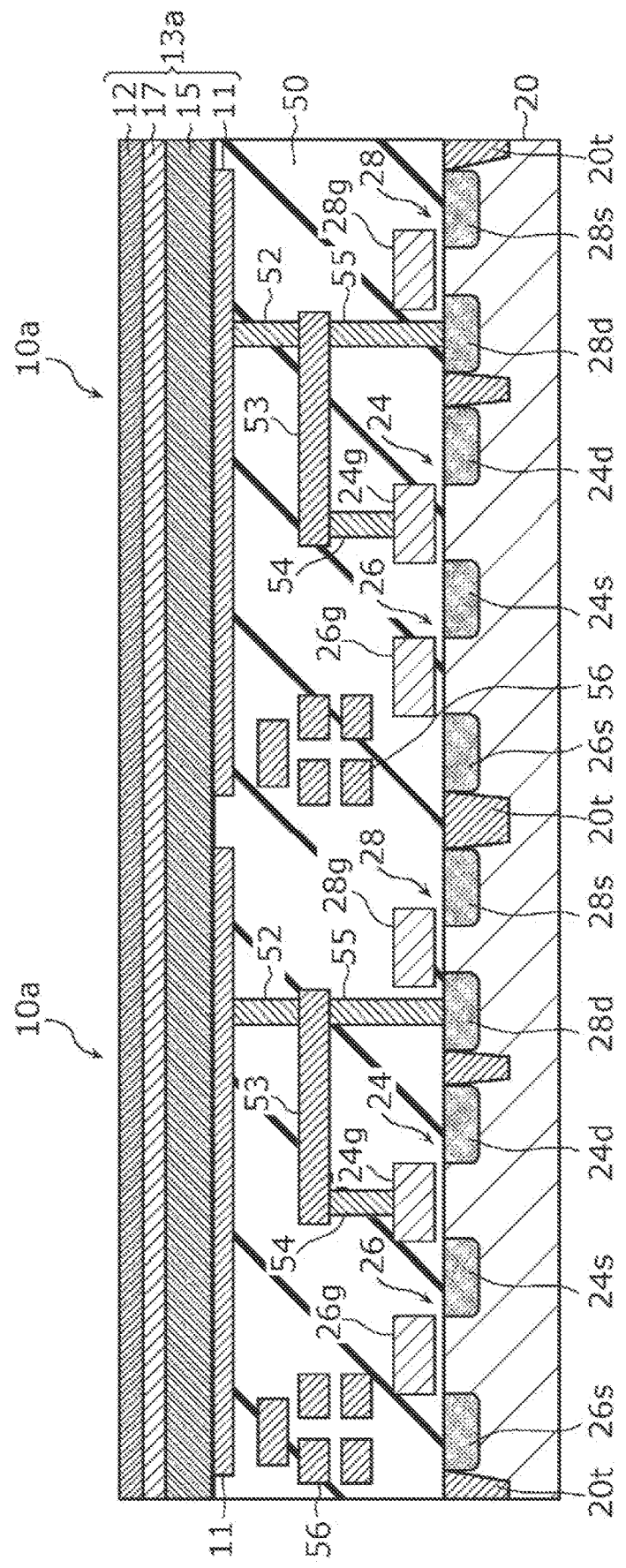
FIG. 5 is a schematic cross-sectional view showing a cross-sectional structure of a plurality of pixels in an imaging device according to embodiment 2.

FIG. 5 is a schematic cross-sectional view showing a cross-sectional structure of a plurality of pixels 10a in an imaging device 100 according to the present embodiment. As shown in FIG. 5, the pixels 10a differs from the pixels 10 in embodiment 1 in that the optical filter 16 is not provided and that a photoelectric conversion unit 13a is provided instead of the photoelectric conversion unit 13.

The photoelectric conversion unit 13a includes: the plurality of pixel electrodes 11; the counter electrode 12; the first photoelectric conversion layer 15 located between the counter electrode 12 and the plurality of pixel electrodes 11; and the first charge transport layer 17 located between the counter electrode 12 and the first photoelectric conversion layer 15. In the present embodiment, the counter electrode 12, the first charge transport layer 17, the first photoelectric conversion layer 15, and the plurality of pixel electrodes 11 are disposed in this order from the light incident side of the imaging device 100. Specifically, the first charge transport layer 17 is disposed on the light incident side of the first photoelectric conversion layer 15. The first light-shielding body in the present embodiment includes the first charge transport layer 17.

As shown in FIG. 5, the first charge transport layer 17 is disposed in contact with the first photoelectric conversion layer 15 and with the counter electrode 12. The first charge transport layer 17 has the function of transporting charges to be collected by the counter electrode 12 among positive and negative charges generated in the first photoelectric conversion layer 15.

The first charge transport layer 17 has a non-zero light absorptance at wavelengths in at least part of the second wavelength range. The first charge transport layer 17 may have a non-zero light absorptance at wavelengths including a wavelength at which the organic molecules exhibit the maximum light absorptance within the second wavelength range. The first charge transport layer 17 may have a non-zero light absorptance at all the wavelengths in the second wavelength range. The first charge transport layer 17 may transmit substantially no light in the second wavelength range.

The first charge transport layer 17 has significant light transparency in at least part of the first wavelength range. When the semiconducting carbon nanotubes have a plurality of resonance wavelengths, the first charge transport layer 17 may have significant transparency at any of these resonance wavelengths of the semiconducting carbon nanotubes.

The light transmittance of the first charge transport layer 17 depends on the light absorption coefficient of the material forming the first charge transport layer 17 and the thickness of the first charge transport layer 17.

The transmittance of light in the second wavelength range through the first charge transport layer 17 may be equal to or less than 5% or may be equal to or less than 1%.

Figure 6:
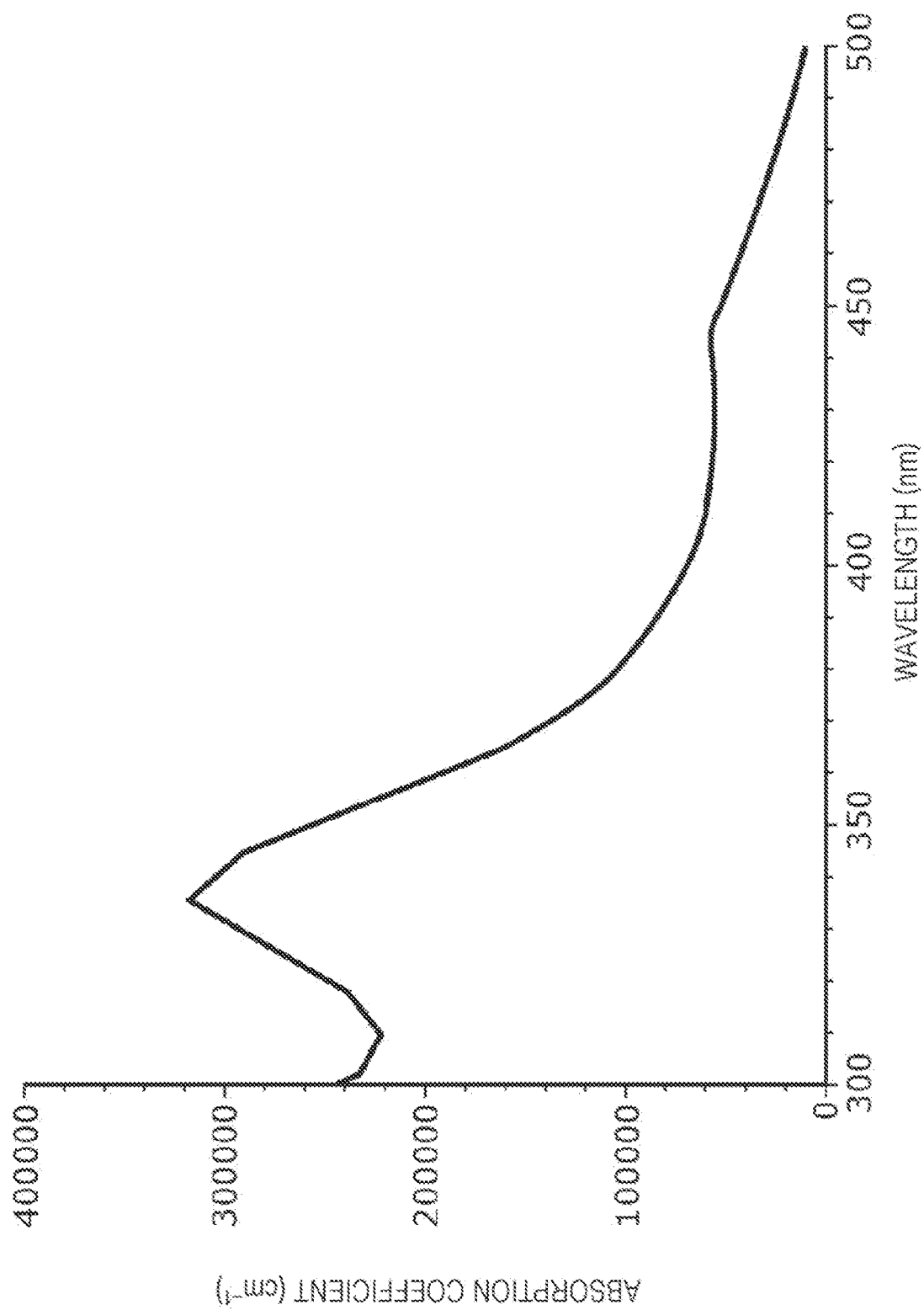
FIG. 6 is a graph showing the absorption spectrum of C60.

The transmittance of the first charge transport layer 17 will be described using C60 having negative charge transportability as an example. FIG. 6 is a graph showing the absorption spectrum of C60. As shown in FIG. 6, C60 has a maximum absorption wavelength at 335 nm.

Figure 7:
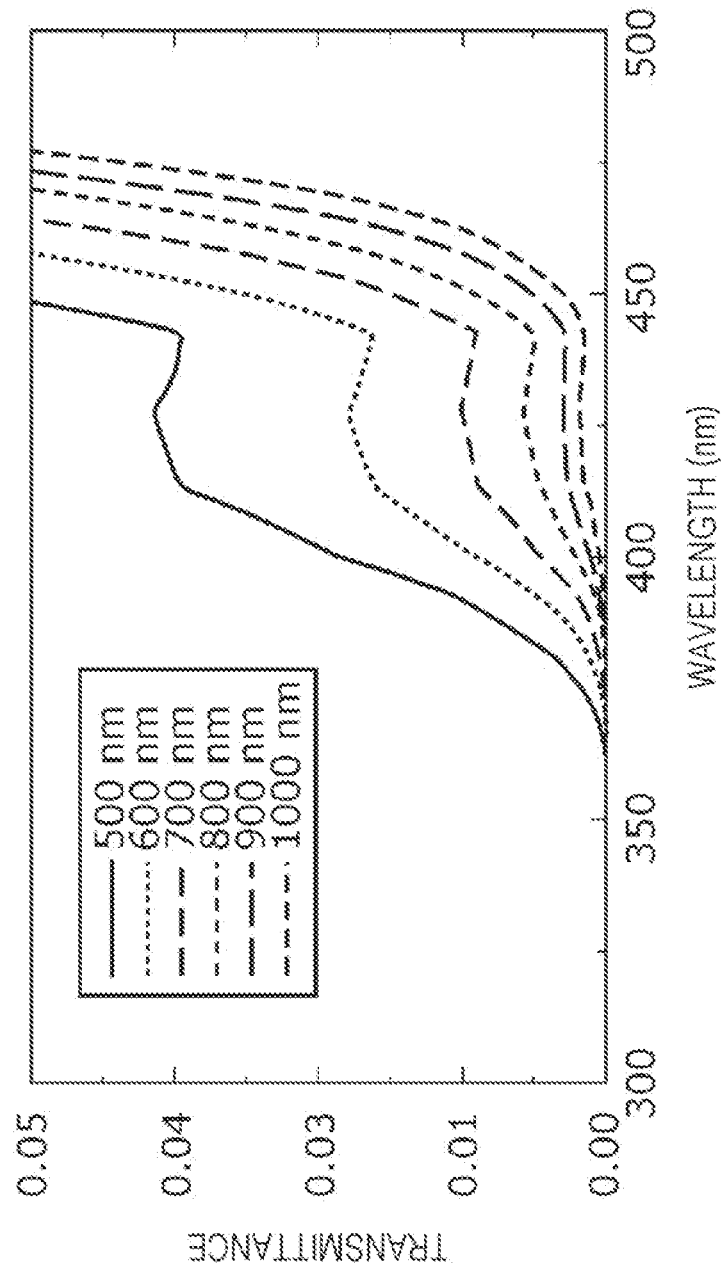
FIG. 7 is a graph showing the results of simulations of the transmittance of C60 layers having different thicknesses.

FIG. 7 is a graph showing the results of simulations of the transmittance of C60 layers with different thicknesses. In the transmittance simulation results shown in FIG. 7, the vertical axis represents transmittance, and the horizontal axis represents wavelength. In FIG. 7, the transmittance is 1 when the entire amount of light at a wavelength on the horizontal axis is transmitted. For example, when the transmittance is converted to a percentage, 1 is 100%, and 0.01 is 1%.

Although not illustrated, the light transmittance of a C60 layer having a thickness equal to or less than 1000 nm at a wavelength equal to or longer than 600 nm is equal to or more than 50%. As shown in FIG. 7, the light transmittance of a C60 layer having a thickness equal to or more than 500 nm at a wavelength equal to or shorter than 440 nm is equal to or less than 5%, and the light transmittance of a C60 layer having a thickness equal to or more than 1000 nm at a wavelength equal to or shorter than 440 nm is equal to or less than 1%. C60 has the function of transporting negative charges. Therefore, the C60 layer function as a charge transport layer in the imaging device 100 including the counter electrode 12 that collects negative charges and also has the function of reducing the ratio of light that has wavelengths equal to or less than 440 nm and reaches the first photoelectric conversion layer 15.

As described above, from the viewpoint of reducing the transmittance of light in the second wavelength range, the thickness of the first charge transport layer 17 may be equal to or more than 500 nm and may be equal to or more than 1000 nm.

No particular limitation is imposed on the charge transport material of the first charge transport layer 17 so long as the charge transport material has the above-described light transparency. Examples of the charge transport material include fullerenes and fullerene derivatives such as PCBM. The first charge transport layer 17 may be composed of one material or may be composed of a plurality of materials. For example, a mixture of a plurality of materials having different absorption spectra allows the light transmittance to be reduced in a wider wavelength range. The first charge transport layer 17 may be formed of a mixture of the charge transport material and a non-charge transport material. For example, a material having the function of transporting charges may be selected as the charge transport material, and a material having a desired absorption spectrum, e.g., absorbing light in the second wavelength range, may be selected as the non-charge transport material.

Embodiment 3

Next, embodiment 3 will be described. Embodiment 3 differs from embodiment 1 in that a second photoelectric conversion layer instead of the optical filter is used as the first light-shielding body. The difference from embodiment 1 will be mainly described, and the description of common features will be omitted or simplified.

[Structure of Photoelectric Conversion Unit]

Figure 8:
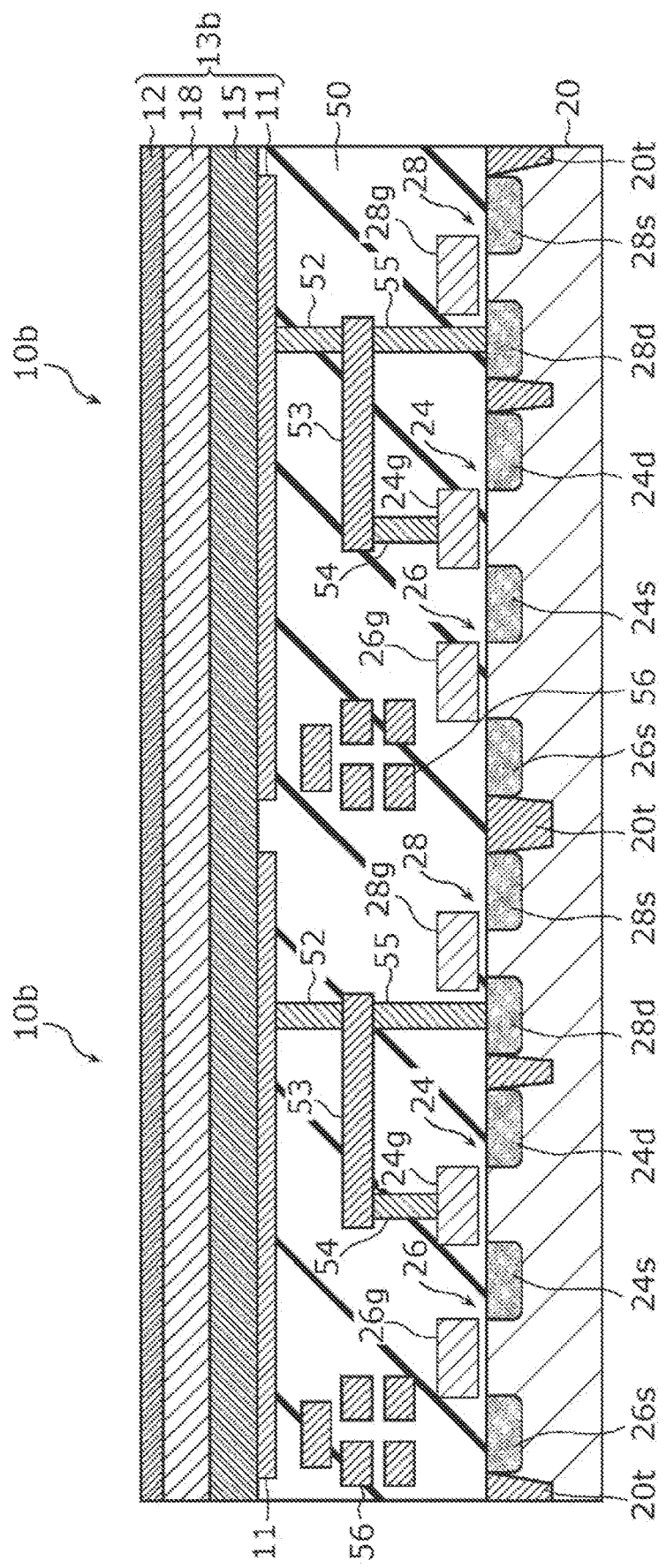
FIG. 8 is a schematic cross-sectional view showing a cross-sectional structure of a plurality of pixels in an imaging device according to embodiment 3.

FIG. 8 is a schematic cross-sectional view showing a cross-sectional structure of a plurality of pixels 10b in an imaging device 100 according to the present embodiment. As shown in FIG. 8, the pixels 10b differ from the pixels 10 in embodiment 1 in that the optical filter 16 is not provided and that a photoelectric conversion unit 13b is provided instead of the photoelectric conversion unit 13.

The photoelectric conversion unit 13b includes: the plurality of pixel electrodes 11; the counter electrode 12; the first photoelectric conversion layer 15 located between the counter electrode 12 and the plurality of pixel electrodes 11; and the second photoelectric conversion layer 18 located between the counter electrode 12 and the first photoelectric conversion layer 15. In the present embodiment, the counter electrode 12, the second photoelectric conversion layer 18, the first photoelectric conversion layer 15, and the plurality of pixel electrodes 11 are disposed in this order from the light incident side of the imaging device 100. Specifically, the second photoelectric conversion layer 18 is disposed on the light incident side of the first photoelectric conversion layer 15. The first light-shielding body in the present embodiment includes the second photoelectric conversion layer 18.

The second photoelectric conversion layer 18 contains a donor material and an acceptor material. The donor material contained in the second photoelectric conversion layer 18 differs from the semiconducting carbon nanotubes and functions as a donor for the acceptor material contained in the second photoelectric conversion layer 18. The acceptor material contained in the second photoelectric conversion layer 18 functions as an acceptor for the donor material contained in the second photoelectric conversion layer 18.

The acceptor material contained in the first photoelectric conversion layer 15 and the acceptor material contained in the second photoelectric conversion layer 18 may be the same material or may be different materials. For example, the acceptor material contained in the first photoelectric conversion layer 15 and the acceptor material contained in the second photoelectric conversion layer 18 may both be C60. The acceptor material contained in the first photoelectric conversion layer 15 may be C60, and the acceptor material contained in the second photoelectric conversion layer 18 may be PCBM.

The second photoelectric conversion layer 18 has a non-zero light absorptance at wavelengths in at least part of the second wavelength range. The second photoelectric conversion layer 18 may have a non-zero light absorptance at wavelengths including a wavelength at which the organic molecules exhibit the maximum light absorptance within the second wavelength range. The second photoelectric conversion layer 18 may have a non-zero light absorptance at all the wavelengths in the second wavelength range. The second photoelectric conversion layer 18 may transmit substantially no light in the second wavelength range.

The second photoelectric conversion layer 18 has significant light transparency in at least part of the first wavelength range. When the semiconducting carbon nanotubes have a plurality of resonance wavelengths, the second photoelectric conversion layer 18 may have significant transparency at any of these resonance wavelengths of the semiconducting carbon nanotubes.

It is preferable that, for example, wavelengths at which the second photoelectric conversion layer 18 transmits substantially no light are shorter than the second resonance wavelength of the semiconducting carbon nanotubes.

The light transmittance of the second photoelectric conversion layer depends on the light absorption coefficients of the materials forming the second photoelectric conversion layer 18 and the thickness of the second photoelectric conversion layer 18.

When, for example, the donor material in the second photoelectric conversion layer 18 is P3HT (poly-3-hexylthiophene) and the acceptor material is PCBM, the second photoelectric conversion layer 18 formed from a film of the mixture of the donor material and the acceptor material does not exhibit significant absorption at wavelengths equal to or longer than about 700 nm. Specifically, the mixture film transmits light with wavelengths equal to or longer than about 700 nm. However, the mixture film absorbs light with wavelengths equal to or shorter than about 700 nm. For example, the light absorption coefficient of the mixture film is equal to or more than $5\times10^4$ cm$^{-1}$ in the range of equal to or more than 390 nm to equal to or less than 550 nm. In this case, when the thickness of the mixture film is equal to or more than 10 nm, the light transmittance of the mixture film in the range of equal to or more than 390 nm to equal to or less than 550 nm is equal to or less than 1%. Therefore, even when the first photoelectric conversion layer 15 contains, for example, PFO-BT as the semiconducting polymer, the generation of fluorescence from the PFO-BT is prevented because the light transmittance of the second photoelectric conversion layer 18 in the second wavelength range of the PFO-BT is equal to or less than 1%.

The light absorption coefficient used in the above computation is a value in C. Stelling, C. R. Singh, M. Karg, T. A. F. Konig, M. Thelakkat, M. Retsch. Plasmonic nanomeshes: their ambivalent role as transparent electrodes in organic solar cells, Sci. Rep. 7, 42530 (2017)—see Supplementary information (Numerical data kindly provided by Tobias Konig). The value of the light absorption coefficient may slightly vary depending on the mixing ratio and the film quality.

The donor material contained in the second photoelectric conversion layer 18 may have a quantum efficiency for light in the second wavelength range. In this case, light in the second wavelength range that is absorbed by the donor material contained in the second photoelectric conversion layer 18 is converted to energy for generating hole-electron pairs and does not reach the organic molecules contained in the first photoelectric conversion layer 15.

No particular limitation is imposed on the donor and acceptor materials contained in the second photoelectric conversion layer 18 so long as these materials can form a mixture film having the transparency described above. The donor material is, for example, phthalocyanine, naphthalocyanine, a phthalocyanine derivative, or a naphthalocyanine derivative because they have a high absorption coefficient in the ultraviolet to near-infrared wavelength range and function as good donors. The donor material may be Alq3 (tris(8-quinolinolato)aluminum), which is a donor material having a high light absorption coefficient in the range of 300 nm to 500 nm. The second photoelectric conversion layer 18 may contain one donor material, or a plurality of donor materials may be contained in the second photoelectric conversion layer 18. For example, when a plurality of donor materials with different absorption spectra are used, the light transmittance can be reduced in a wider wavelength range.

Embodiment 4

Next, embodiment 4 will be described. Embodiment 4 differs from embodiment 1 in that a first light-shielding donor material instead of the optical filter is used as the first light-shielding body. The difference from embodiment 1 will be mainly described, and the description of common features will be omitted or simplified.

[Structure of Photoelectric Conversion Unit]

Figure 9:
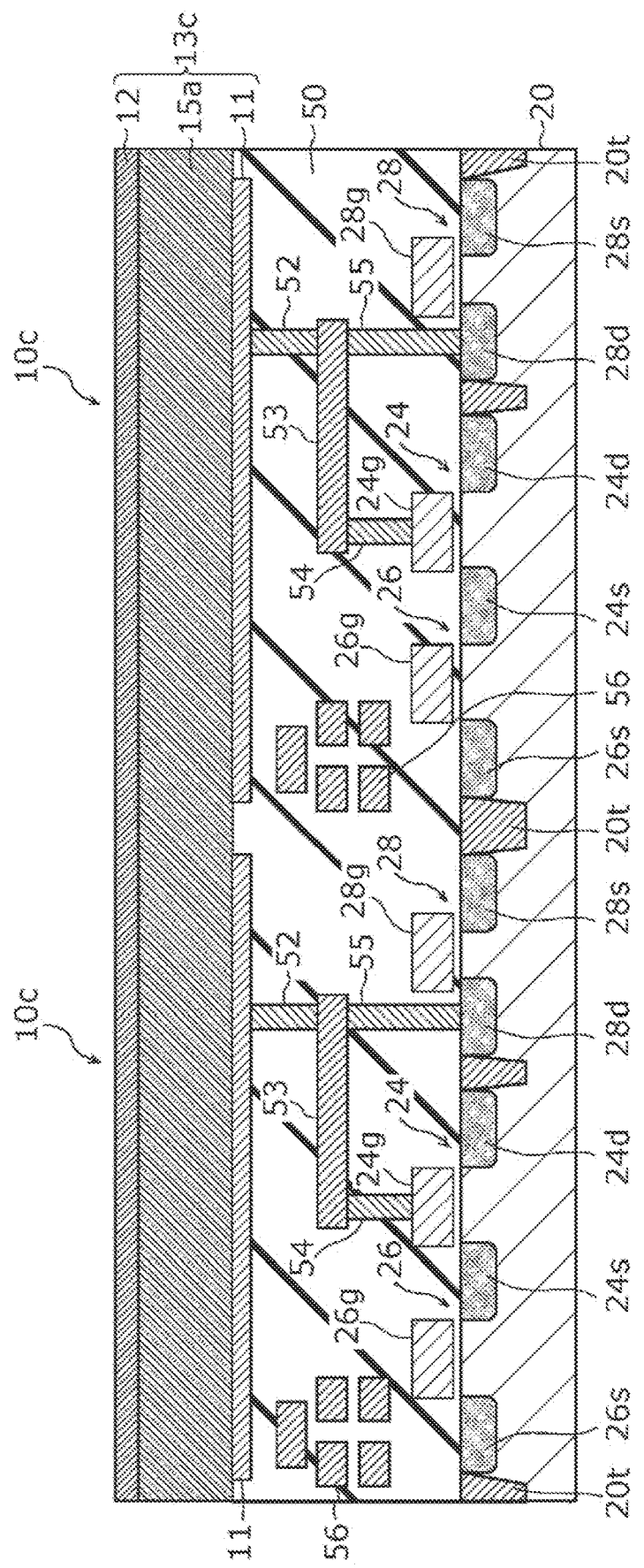
FIG. 9 is a schematic cross-sectional view showing a cross-sectional structure of a plurality of pixels in an imaging device according to embodiment 4.

FIG. 9 is a schematic cross-sectional view showing a cross-sectional structure of a plurality of pixels 10c in an imaging device 100 according to the present embodiment. As shown in FIG. 9, the pixels 10c differ from the pixels 10 in embodiment 1 in that the optical filter 16 is not provided and that a photoelectric conversion unit 13c is provided instead of the photoelectric conversion unit 13.

The photoelectric conversion unit 13c includes: the plurality of pixel electrodes 11; the counter electrode 12; and a first photoelectric conversion layer 15a located between the counter electrode 12 and the plurality of pixel electrodes 11. In the present embodiment, the counter electrode 12, the first photoelectric conversion layer 15a, and the plurality of pixel electrodes 11 are disposed in this order from the light incident side of the imaging device 100. The first photoelectric conversion layer 15a contains the semiconducting carbon nanotubes, the acceptor material, the organic molecules, and the first light-shielding donor material. Specifically, the first light-shielding donor material is located in the first photoelectric conversion layer 15a. The first light-shielding donor material is an example of the first material. The first light-shielding body in the present embodiment contains the first light-shielding donor material.

The first light-shielding donor material generates hole-electron pairs upon reception of incident light. The first light-shielding donor material functions as, for example, a donor for the acceptor material and differs from the semiconducting carbon nanotubes.

The first light-shielding donor material has a non-zero light absorptance at wavelengths in at least part of the second wavelength range. The first light-shielding donor material may have a non-zero light absorptance at wavelengths including a wavelength at which the organic molecules exhibit the maximum light absorptance within the second wavelength range. The first light-shielding donor material may have a non-zero light absorptance at all the wavelengths in the second wavelength range. The light absorption coefficient of the first light-shielding donor material in the second wavelength range may be equal to or higher than the light absorption coefficient of the organic molecules.

In the present embodiment, light in the second wavelength range that enters the first photoelectric conversion layer 15a may be absorbed by the organic molecules. However, the light in the second wavelength range may be absorbed also by the first light-shielding donor material. The light absorbed by the first light-shielding donor material is converted to energy for generating hole-electron pairs and is not absorbed by the organic molecules. Therefore, when the first light-shielding donor material is contained in the first photoelectric conversion layer 15a, the probability of the occurrence of fluorescence due to absorption of light by the organic molecules decreases.

In the first photoelectric conversion layer 15a, the larger the amount of the first light-shielding donor material relative to the organic molecules, the smaller the probability of the occurrence of fluorescence due to absorption of light by the organic molecules. For example, when the first photoelectric conversion layer 15a contains equal amounts of the organic molecules and the first light-shielding donor material and the light absorption coefficient of the organic molecules and the light absorption coefficient of the first light-shielding donor material in the second wavelength range are the same, the probability of absorption of light in the second wavelength range by the organic molecules is one half of that when the first light-shielding donor material is not present.

The first light-shielding donor material is a material that has the light absorption characteristics described above and functions as a donor for the acceptor material. Examples of the first light-shielding donor material include phthalocyanine, naphthalocyanine, phthalocyanine derivatives, and naphthalocyanine derivatives.

Embodiment 5

Next, embodiment 5 will be described. Embodiment 5 differs from embodiment 1 in that a second light-shielding body is used instead of the first light-shielding body. The second light-shielding body absorbs or reflects light with wavelengths in at least part of the third wavelength range. The second light-shielding body is located in the first photoelectric conversion layer or between the first photoelectric conversion layer and the plurality of pixel electrodes. The details of the second light-shielding body will be described later using various examples. The difference from embodiment 1 will be mainly described, and the description of common features will be omitted or simplified.

[Structure of Photoelectric Conversion Unit]

Figure 10:
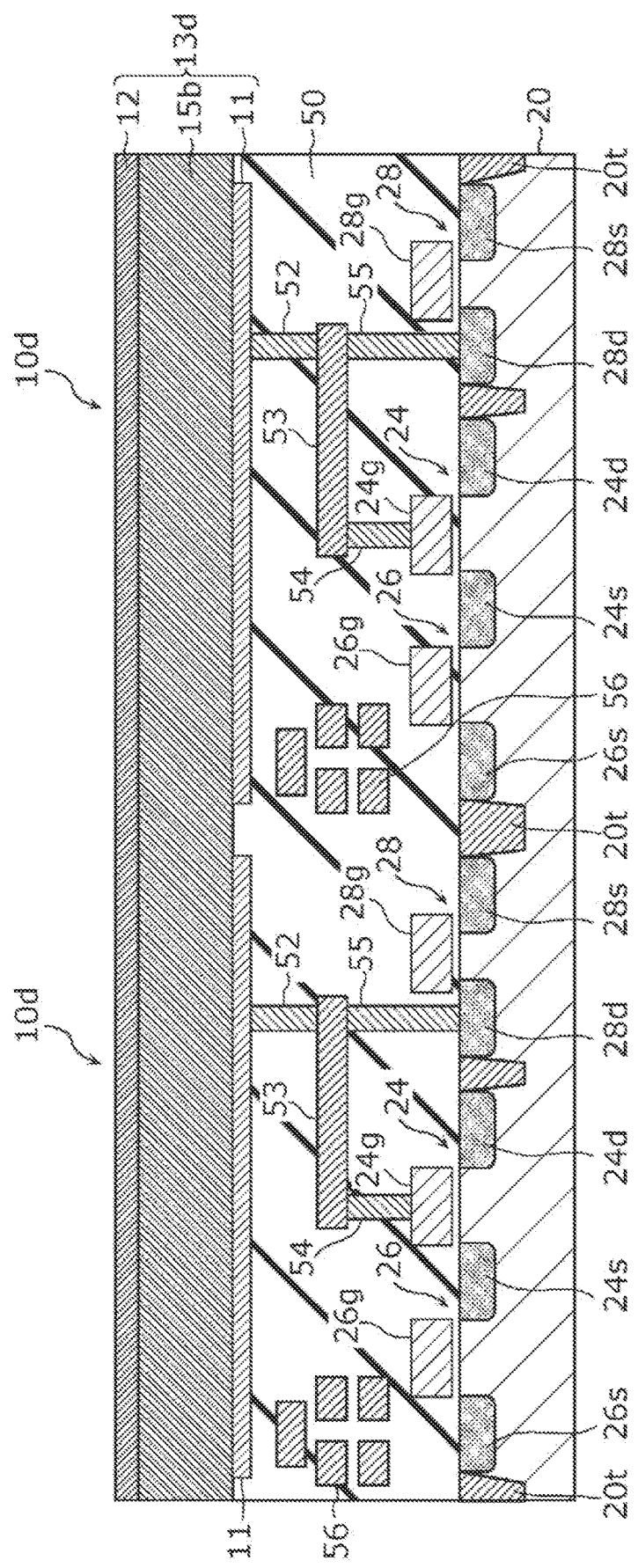
FIG. 10 is a schematic cross-sectional view showing a cross-sectional structure of a plurality of pixels in an imaging device according to embodiment 5.

FIG. 10 is a schematic cross-sectional view showing a cross-sectional structure of a plurality of pixels 10d in an imaging device 100 according to the present embodiment. As shown in FIG. 10, the pixels 10d differ from the pixels 10 in embodiment 1 in that the optical filter 16 is not provided and that a photoelectric conversion unit 13d is provided instead of the photoelectric conversion unit 13.

The photoelectric conversion unit 13d includes: the plurality of pixel electrodes 11; the counter electrode 12; and a first photoelectric conversion layer 15b located between the counter electrode 12 and the plurality of pixel electrodes 11. In the present embodiment, the counter electrode 12, the first photoelectric conversion layer 15b, and the plurality of pixel electrodes 11 are disposed in this order from the light incident side of the imaging device 100. The first photoelectric conversion layer 15b contains the semiconducting carbon nanotubes, the acceptor material, the organic molecules, and a second light-shieling donor material. Specifically, the second light-shieling donor material is located in the first photoelectric conversion layer 15b. The second light-shieling donor material is an example of the second material. The second light-shielding body in the present embodiment contains the second light-shieling donor material. The first photoelectric conversion layer 15b may not contain the acceptor material.

The second light-shieling donor material generates hole-electron pairs upon reception of incident light. The second light-shieling donor material functions as, for example, a donor for the acceptor material and differs from the semiconducting carbon nanotubes.

The second light-shielding donor material has a non-zero light absorptance at wavelengths in at least part of the third wavelength range, which is the wavelength range of the fluorescence emitted from the organic molecules. The second light-shielding donor material may have a non-zero light absorptance at wavelengths including a wavelength at which the organic molecules exhibit the maximum fluorescence intensity within the third wavelength range. The second light-shielding donor material may have a non-zero light absorptance at all the wavelengths in the third wavelength range.

In the present embodiment, light in the second wavelength range that enters the first photoelectric conversion layer 15b may be absorbed by the organic molecules. When the organic molecules absorb the light in the second wavelength range, the organic molecules emit fluorescence. However, since the second light-shieling donor material has a non-zero light absorptance in the third wavelength range, part of or all the fluorescence emitted from the organic molecules is absorbed.

The fluorescence emitted from the organic molecules and absorbed by the second light-shielding donor material is converted to energy for generating hole-electron pairs, and the electrons generated are separated from the second light-shielding donor material through, for example, the acceptor material, so that the fluorescence vanishes. Therefore, the amount of the fluorescence reachable to the semiconductor substrate 20 is smaller than that when no second light-shielding donor material is present. The larger the amount of the second light-shielding donor material contained in the first photoelectric conversion layer 15b relative to the organic molecules, the smaller the probability that the fluorescence emitted from the organic molecules reaches the semiconductor substrate 20.

The second light-shielding donor material is a material that has the light absorption characteristics described above and functions as, for example, a donor for the acceptor material. Examples of the second light-shielding donor material include phthalocyanine, naphthalocyanine, phthalocyanine derivatives, and naphthalocyanine derivatives.

Embodiment 6

Next, embodiment 6 will be described. Embodiment 6 differs from embodiment 1 in that a second light-shielding body is used instead of the first light-shielding body. Moreover, embodiment 6 differs from embodiment 5 that uses the second light-shielding body in that a second charge transport layer instead of the second light-shielding donor material is used as the second light-shielding body. The differences from embodiments 1 and 5 will be mainly described, and the description of common features will be omitted or simplified.

[Structure of Photoelectric Conversion Unit]

Figure 11:
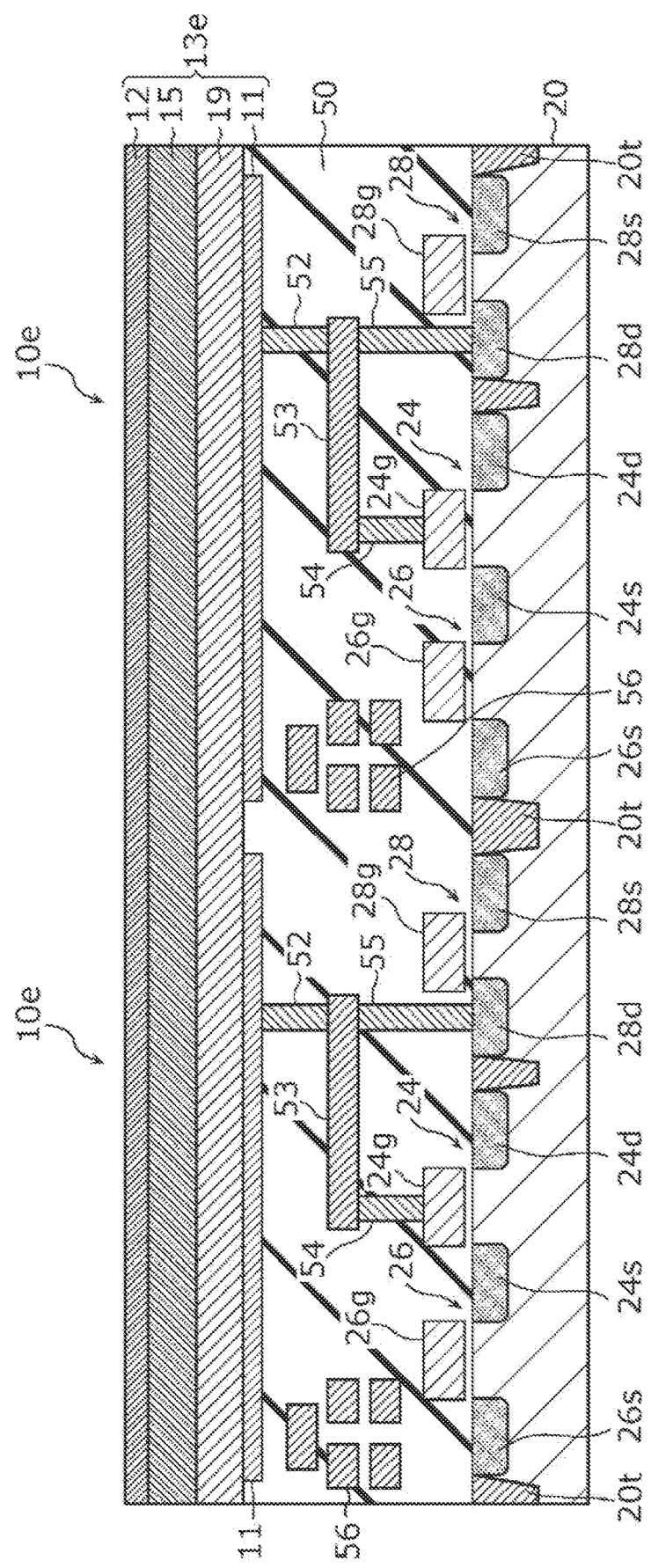
FIG. 11 is a schematic cross-sectional view showing a cross-sectional structure of a plurality of pixels in an imaging device according to embodiment 6.

FIG. 11 is a schematic cross-sectional view showing a cross-sectional structure of a plurality of pixels 10e in an imaging device 100 according to the present embodiment. As shown in FIG. 11, the pixels 10e differ from the pixels 10 in embodiment 1 in that the optical filter 16 is not provided and that a photoelectric conversion unit 13e is provided instead of the photoelectric conversion unit 13.

The photoelectric conversion unit 13e includes: the plurality of pixel electrodes 11; the counter electrode 12; the first photoelectric conversion layer 15 located between the counter electrode 12 and the plurality of pixel electrodes 11; and the second charge transport layer 19 located between the first photoelectric conversion layer 15 and the plurality of pixel electrodes 11. In the present embodiment, the counter electrode 12, the first photoelectric conversion layer 15, the second charge transport layer 19, and the plurality of pixel electrodes 11 are disposed in this order from the light incident side of the imaging device 100. Specifically, the second charge transport layer 19 is disposed on the semiconductor substrate 20 side of the first photoelectric conversion layer 15. The second light-shielding body in the present embodiment includes the second charge transport layer 19.

As shown in FIG. 11, the second charge transport layer 19 is disposed in contact with the first photoelectric conversion layer 15 and with the plurality of pixel electrodes 11. The second charge transport layer 19 has the function of transporting charges to be collected by the pixel electrodes 11 among positive and negative charges generated in the first photoelectric conversion layer 15.

The second charge transport layer 19 has a non-zero light absorptance at wavelengths in at least part of the third wavelength range. The second charge transport layer 19 may have a non-zero light absorptance at wavelengths including a wavelength at which the organic molecules exhibit the maximum light fluorescence intensity within the third wavelength range. The second charge transport layer 19 may have a non-zero light absorptance at all the wavelengths in the third wavelength range. The second charge transport layer 19 may transmit substantially no light in the third wavelength range.

The transmittance of the second charge transport layer 19 depends on the light absorption coefficient of the material forming the second charge transport layer 19 and the thickness of the second charge transport layer 19.

For example, the absorption spectrum and the transmittance when C60 having negative charge transportability is used for the second charge transport layer 19 are as described in embodiment 2 using FIGS. 6 and 7. As shown in FIG. 7, the light transmittance of a C60 layer having a thickness equal to or more than 500 nm at a wavelength equal to or shorter than 440 nm is equal to or less than 5%, and the light transmittance of a C60 layer having a thickness equal to or more than 1000 nm at a wavelength equal to or shorter than 440 nm is equal to or less than 1%. C60 has the function of transporting negative charges. Therefore, the C60 layer functions as a charge transport layer in the imaging device 100 including the pixel electrodes that collect negative charges and also has the function of reducing the ratio of light that has wavelengths equal to or less than 440 nm and reaches the semiconductor substrate 20.

No particular limitation is imposed on the charge transport material of the second charge transport layer 19 so long as the charge transport material has the above-described light transparency. Examples of the charge transport material include fullerenes and fullerene derivatives such as PCBM. The second charge transport layer 19 may be composed of one material or may be composed of a plurality of materials. For example, a mixture of a plurality of materials having different absorption spectra allows the light transmittance to be reduced in a wider wavelength range. The second charge transport layer 19 may be formed of a mixture of the charge transport material and a non-charge transport material. For example, a material having the function of transporting charges may be selected as the charge transport material, and a material having a desired absorption spectrum, e.g., absorbing light in the third wavelength range, may be selected as the non-charge transport material.

As described above, the second charge transport layer 19 is disposed on the semiconductor substrate 20 side of the first photoelectric conversion layer 15 and absorbs or reflects at least part of light in the third wavelength range. In this case, the amount of light in the third wavelength range that reaches the charge storage regions or the control circuits that are formed from the impurity regions etc. of the semiconductor substrate containing silicon can be reduced. Therefore, noise etc. generated when the charge storage regions etc. absorb the fluorescence emitted from the organic molecules can be reduced.

Embodiment 7

Next, embodiment 7 will be described. Embodiment 7 differs from embodiment 1 in that a second light-shielding body is used in addition to the first light-shielding body. The difference from embodiment 1 will be mainly described, and the description of common features will be omitted or simplified.

[Structure of Photoelectric Conversion Unit]

Figure 12:
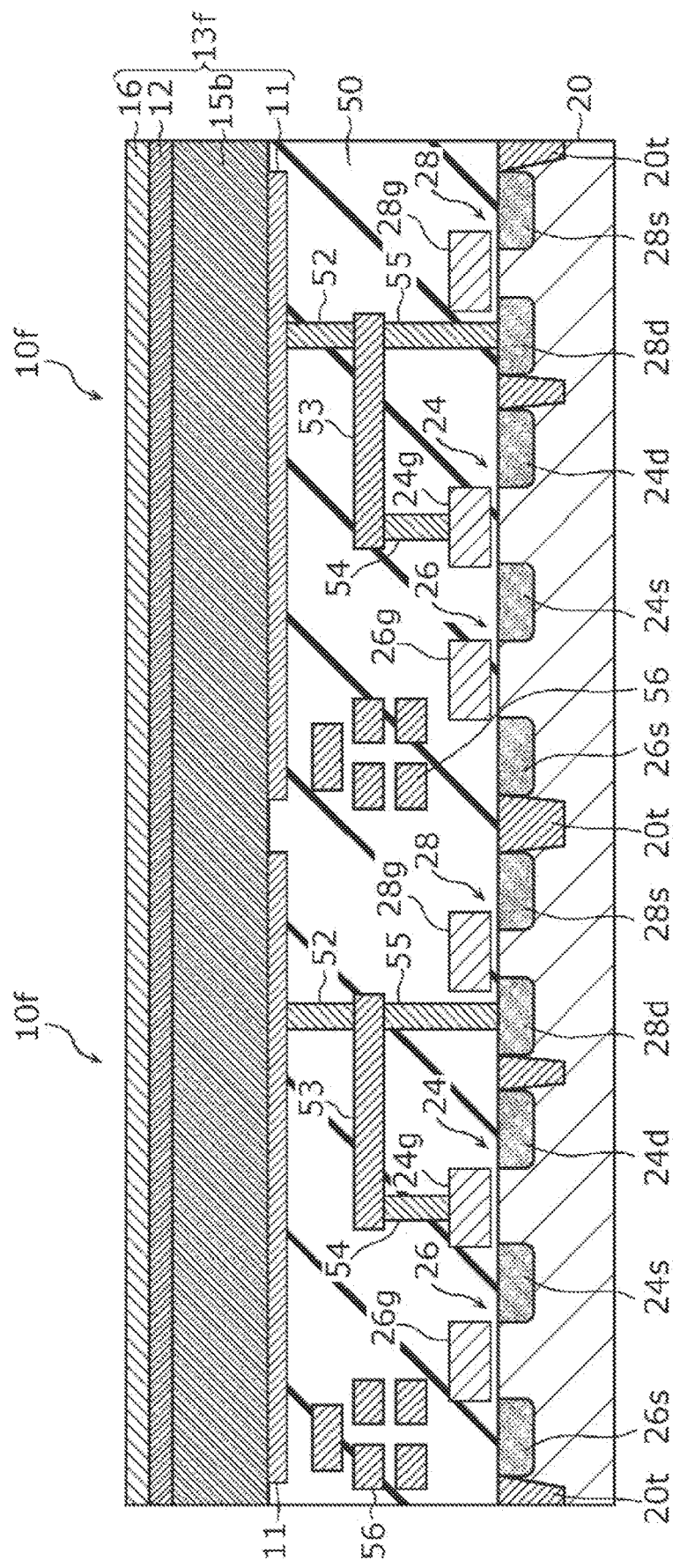
FIG. 12 is a schematic cross-sectional view showing a cross-sectional structure of a plurality of pixels in an imaging device according to embodiment 7.

FIG. 12 is a schematic cross-sectional view showing a cross-sectional structure of a plurality of pixels 10f in an imaging device 100 according to the present embodiment. As shown in FIG. 12, the pixels 10f differ from the pixels 10 in embodiment 1 in that a photoelectric conversion unit 13f is provided instead of the photoelectric conversion unit 13.

The photoelectric conversion unit 13f includes: the plurality of pixel electrodes 11; the counter electrode 12; and a first photoelectric conversion layer 15b located between the counter electrode 12 and the plurality of pixel electrodes 11b. The optical filter 16 is disposed on the counter electrode 12 in the photoelectric conversion unit 13f. In the present embodiment, the optical filter 16, the counter electrode 12, the first photoelectric conversion layer 15b, and the plurality of pixel electrodes 11 are disposed in this order from the light incident side of the imaging device 100. Specifically, the optical filter 16 is disposed on the light incident side of the first photoelectric conversion layer 15b. The first photoelectric conversion layer 15b contains the semiconducting carbon nanotubes, the acceptor material, the organic molecules, and the second light-shieling donor material, as in embodiment 5.

The imaging device 100 according to the present embodiment includes the first light-shielding body and the second light-shielding body. The first light-shielding body in the present embodiment includes the optical filter 16, and the second light-shielding body in the present embodiment include the second light-shieling donor material. Therefore, the optical filter 16 absorbs or reflects light in the second wavelength range, and emission of fluorescence from the organic molecules can be reduced. Even when the organic molecules emit fluorescence, the second light-shieling donor material absorbs the fluorescence, so that the fluorescence is prevented from reaching the semiconductor substrate 20.

Other Embodiments

One or a plurality of modes of the imaging device have been described based on the embodiments. However, the present disclosure is not limited to these embodiments. Various modifications to the embodiments that are conceivable by a person of skill in the art and modes obtained by combining components in difference embodiments are also included in the scope of the present disclosure, so long as they do not depart from the spirit of the present disclosure.

For example, in the above embodiments, the first photoelectric conversion layer is a hetero bulk layer-type photoelectric conversion layer containing the semiconducting carbon nanotubes and the acceptor material that functions as an acceptor for the semiconducting carbon nanotubes, but this is not a limitation. The first photoelectric conversion layer may be a photoelectric conversion layer having a two-layer structure formed by joining a layer containing the semiconducting carbon nanotubes and a layer containing the acceptor material together.

For example, in embodiment 6 above, the second charge transport layer is disposed as the second light-shielding body, but this is not a limitation. A third photoelectric conversion layer that absorbs light with wavelengths in at least part of the third wavelength range may be disposed as the second light-shielding body instead of the second charge transport layer.

For example, the imaging device may include a combination of a plurality of the first and second light-shielding bodies used in the above embodiments.

The imaging device according to the present disclosure can be applied to high-resolution imaging using, for example, infrared wavelengths in various camera systems and sensor systems such as medical cameras, monitoring cameras, vehicle-mounted cameras, range cameras, microscope cameras, cameras for drones, and cameras for robots.

What is claimed is:

1. An imaging device comprising:
   a semiconductor substrate;
   pixel electrodes located above the semiconductor substrate and each electrically connected to the semiconductor substrate;
   a counter electrode located above the pixel electrodes;
   a first photoelectric conversion layer located between the counter electrode and the pixel electrodes; and
   at least one first light-shielding body located in or above the first photoelectric conversion layer, wherein
   the first photoelectric conversion layer contains
      a semiconducting carbon nanotube having a property of absorbing light in a first wavelength range and
      an organic molecule that covers the semiconducting carbon nanotube and that has a property of absorbing light in a second wavelength range and emitting fluorescence in a third wavelength range,
   the at least one first light-shielding body absorbs or reflects light in at least part of the second wavelength range.

2. The imaging device according to claim 1, wherein the at least one first light-shielding body includes an optical filter that is located above the counter electrode and that absorbs or reflects light in at least part of the second wavelength range.

3. The imaging device according to claim 1, wherein the at least one first light-shielding body includes a first charge transport layer that is located between the first photoelectric conversion layer and the counter electrode and that absorbs light in at least part of the second wavelength range.

4. The imaging device according to claim 1, wherein the at least one first light-shielding body includes a second photoelectric conversion layer that is located between the first photoelectric conversion layer and the counter electrode and that absorbs light in at least part of the second wavelength range.

5. The imaging device according to claim 1, wherein
   the at least one first light-shielding body contains a first material that differs from the semiconducting carbon nanotube and that absorbs light in at least part of the second wavelength range, and the first material is located in the first photoelectric conversion layer.

6. The imaging device according to claim 1, wherein the at least one first light-shielding body transmits light in at least part of the first wavelength range.

7. The imaging device according to claim 1, further comprising at least one second light-shielding body that is located in the first photoelectric conversion layer or between the first photoelectric conversion layer and the pixel electrodes and that absorbs or reflects light in at least part of the third wavelength range.

8. The imaging device according to claim 7, wherein
the at least one second light-shielding body contains a second material that differs from the semiconducting carbon nanotube and that absorbs light in at least part of the third wavelength range, and the second material is located in the first photoelectric conversion layer.

9. The imaging device according to claim 7, wherein the at least one second light-shielding body includes a second charge transport layer that is located between the first photoelectric conversion layer and the pixel electrodes and that absorbs light in at least part of the third wavelength range.

10. The imaging device according to claim 1, wherein the organic molecule includes at least one selected from the group consisting of a semiconducting polymer and a low-molecular weight organic molecule.

11. The imaging device according to claim 10, wherein the semiconducting polymer is a polymer having a fluorene skeleton or a polymer having a thiophene skeleton.

12. The imaging device according to claim 10, wherein the organic molecule has a six-membered ring structure.

13. The imaging device according to claim 10, wherein the organic molecule includes at least one selected from the group consisting of an alkyl chain having 4 or more carbon atoms and an alkylene chain having 4 or more carbon atoms.

14. The imaging device according to claim 1, wherein the first photoelectric conversion layer further contains a third material that functions as an acceptor for the semiconducting carbon nanotube.

15. The imaging device according to claim 5, wherein the first photoelectric conversion layer further contains a third material that functions as an acceptor for the semiconducting carbon nanotube and the first material.

16. The imaging device according to claim 8, wherein the first photoelectric conversion layer further contains a third material that functions as an acceptor for the semiconducting carbon nanotube and the second material.

17. The imaging device according to claim 1, wherein the semiconductor substrate contains silicon.

18. An imaging device comprising:
a semiconductor substrate;
pixel electrodes located above the semiconductor substrate and each electrically connected to the semiconductor substrate;
a counter electrode located above the pixel electrodes;
a first photoelectric conversion layer located between the counter electrode and the pixel electrodes; and
at least one second light-shielding body located in the first photoelectric conversion layer or between the first photoelectric conversion layer and the pixel electrodes, wherein
the first photoelectric conversion layer contains
a semiconducting carbon nanotube having a property of absorbing light in a first wavelength range and
an organic molecule that covers the semiconducting carbon nanotube and that has a property of absorbing light in a second wavelength range and emitting fluorescence in a third wavelength range, and
the at least one second light-shielding body absorbs or reflects light in at least part of the third wavelength range.

19. The imaging device according to claim 18, wherein
the at least one second light-shielding body contains a second material that differs from the semiconducting carbon nanotube and that absorbs light in at least part of the third wavelength range, and
the second material is located in the first photoelectric conversion layer.

20. The imaging device according to claim 18, wherein the at least one second light-shielding body includes a second charge transport layer that is located between the first photoelectric conversion layer and the pixel electrodes and that absorbs light in at least part of the third wavelength range.

* * * * *